US009446949B2

(12) United States Patent
Pokroy et al.

(10) Patent No.: US 9,446,949 B2
(45) Date of Patent: Sep. 20, 2016

(54) VICINAL SURFACES OF POLYCRYSTALLINE STRUCTURES

(71) Applicant: Technion Research and Development Foundation Ltd., Haifa (IL)

(72) Inventors: Boaz Pokroy, Haifa (IL); Shirly Borukhin, Atlit (IL)

(73) Assignee: Technion Research and Development Foundatin Ltd., Haifa (IL)

( * ) Notice: Subject to any disclaimer, the term of this patent is extended or adjusted under 35 U.S.C. 154(b) by 179 days.

(21) Appl. No.: 13/774,400

(22) Filed: Feb. 22, 2013

(65) Prior Publication Data

US 2013/0216780 A1    Aug. 22, 2013

Related U.S. Application Data

(60) Provisional application No. 61/601,581, filed on Feb. 22, 2012.

(51) Int. Cl.
| | |
|---|---|
| C23C 14/00 | (2006.01) |
| C23C 16/01 | (2006.01) |
| B82B 3/00 | (2006.01) |
| H01L 21/02 | (2006.01) |
| H01L 21/00 | (2006.01) |

(52) U.S. Cl.
CPC ......... B82B 3/0038 (2013.01); C23C 14/0005 (2013.01); C23C 16/01 (2013.01); H01L 21/02428 (2013.01); *Y10T 428/24355* (2015.01)

(58) Field of Classification Search
USPC ....................................................... 257/496
See application file for complete search history.

(56) References Cited

U.S. PATENT DOCUMENTS

| | | | |
|---|---|---|---|
| 7,569,470 B2 | 8/2009 | Fernandez-Ceballos et al. | |
| 2006/0202292 A1* | 9/2006 | Shvets et al. | 257/422 |
| 2008/0206936 A1* | 8/2008 | Fernandez-Ceballos et al. | 438/151 |

OTHER PUBLICATIONS

Altman (2010) Chemistry. CO prefers the aisle seat. Science 327(5967):789-790.
Barth et al., (2005) Engineering atomic and molecular nanostructures at surfaces. Nature 437(7059): 671-679.
Battaglini et al., (2008) Self-assembly of an octanethiol monolayer on a gold-stepped surface. Langmuir 24(5): 2042-2050.
Blackstock et al., (2003) Ultra-flat platinum surfaces from template-stripping of sputter deposited films. Surface Science 546(2-3): 87-96.
Bond and Thompson (2000) Gold-catalysed oxidation of carbon monoxide. Gold Bull 33: 41.
Borukhin and Pokroy (2011) Formation and elimination of surface nanodefects on ultraflat metal surfaces produced by template stripping. Langmuir 27(22): 13415-13419.
Chai and Klein (2007) Large area, molecularly smooth (0.2 nm rms) gold films for surface forces and other studies. Langmuir 23(14): 7777-7783.

(Continued)

*Primary Examiner* — Humera Sheikh
*Assistant Examiner* — Lucas Wang
(74) *Attorney, Agent, or Firm* — Rothwell, Figg, Ernst & Manbeck, P.C.

(57) ABSTRACT

The present invention provides vicinal surfaces of polycrystalline materials and a method for their preparation. The method includes the deposition of a polycrystalline material on a substrate followed by removing the material from the substrate so as to expose a vicinal surface having stepped terraces. The step of removing the material from the substrate may be preceded by annealing. The vicinal surfaces are useful for a variety of applications.

22 Claims, 22 Drawing Sheets

(56) References Cited

OTHER PUBLICATIONS

Dakkouri et al., (1996) Scanning Tunneling Microscopy Study of L-Cysteine on Au(111). Langmuir 12: 2849-2852.

Didiot et al., (2007) Nanopatterning the electronic properties of gold surfaces with self-organized superlattices of metallic nanostructures. Nat Nanotechnol 2(10): 617-621.

Dodero et al., (2000) I-Cysteine chemisorption on gold: an XPS and STM study. Colloids and Surfaces A: Physicochemical and Engineering Aspects 175(1-2): 121-128.

Du et al., (2006) Selective Nontemplated Adsorption of Organic Molecules on Nanofacets and the Role of Bonding Patterns. Physical Review Letters 97: 156105.

Frenken and Stoltze (1999) Are Vicinal Metal Surfaces Stable? Physical Review Letters 82: 3500-3503.

Gambardella et al., (2002) Ferromagnetism in one-dimensional monatomic metal chains. Nature 416(6878): 301-304.

George and Glaunsinger (1994) The electrical and structural properties of gold films and mercury-covered gold films. Thin Solid Films 245(1-2): 215-224.

Hashemi et al., (2010) Magnetic states of M-Fe wires (M=Sc—Ni) on vicinal Cu(111) from first principles. Physical Review B 81: 104418.

Hegner et al., (1993) Ultralarge atomically flat template-stripped Au surfaces for scanning probe microscopy. Surf Sci291: 39-46.

Hyman et al., (1998) Magnetic Reversal on Vicinal Surfaces. Physical Review B 58(14): 9276-9286.

Ihs and Liedberg (1991) Chemisorption of I-cysteine and 3-mercaptopropionic acid on gold and copper surfaces: An infrared reflection-absorption study. Journal of Colloid and Interface Science 144(1): 282-292.

Koch (1994) The intrinsic stress of polycrystalline and epitaxial thin metal films. J Phys: Condens Matter 6: 9519.

Kröger et al., (2006) Molecules on vicinal Au surfaces studied by scanning tunnelling microscopy. J Phys: Condens Matter 18: S51.

Kühnle et al., (2002) Chiral recognition in dimerization of adsorbed cysteine observed by scanning tunnelling microscopy. Nature 415(6874): 891-893.

Levlin et al., (1999) Adsorption of mercury on gold and silver surfaces. Fresenius J Anal Chem 365: 577-586.

Liu et al., (2002) Catalytic Role of Gold in Gold-Based Catalysts: A Density Functional Theory Study on the CO Oxidation on Gold. JACS 124: 14770-14779.

Massong et al., (2001) The co-catalytic effect of Sn, Ru and Mo decorating steps of Pt(111) vicinal electrode surfaces on the oxidation of CO. Electrochimica Acta 46(5): 701-707.

Mrksich (2002) What can surface chemistry do for cell biology? Current Opinion in Chemical Biology 6: 794-797.

Mugarza et al., (2001) Electron Confinement in Surface States on a Stepped Gold Surface Revealed by Angle-Resolved Photoemission. Phys Rev Lett 87: 107601.

Ortega et al., (2002) One-dimensional versus two-dimensional surface states on stepped Au(111) Physical Review B 65(16): 165413.

Repain et al., (2000) Interplay between Atomic and Mesoscopic Order on Gold Vicinal Surfaces. Physical Review Letters 84: 5367-5370.

Rousset et al., (2002) Self-ordering on crystal surfaces: fundamentals and applications. Materials Science and Engineering: B96 169-177.

Rousset et al., (2003) Self-ordering of Au(111) vicinal surfaces and application to nanostructure organized growth. J Phys: Condens Matter 15: S3363.

Sarikaya et al., (2003) Molecular biomimetics: nanotechnology through biology. Nat Mater 2(9): 577-585.

Shiraki et al., (2004) The growth of Fe, Ni and Co on vicinal Au(111) surfaces. Applied Surface Science 237(1-4): 284-290.

Spiridis et al., (2002) Correlation of morphology and magnetic properties in ultrathin epitaxial Co films on Au(111). Surface Science 507-510: pp. 546-552.

Tao et al., (2010) Break-up of stepped platinum catalyst surfaces by high CO coverage. Science 327(5967): 850-853.

Tegenkamp (2009) Vicinal surfaces for functional nanostructures. J Phys: Condens Matter 21: 013002.

Teichert (2002) Self-organization of nanostructures in semiconductor heteroepitaxy. Physics Reports 365(5-6) 335-432.

Tejeda et al., (2005) Periodic magnetic anisotropy in ultrathin ferromagnetic films on faceted surfaces. Europhysics Letters 71: 117.

Treier et al., (2008) Living on the edge: A nanographene molecule adsorbed across gold step edges. Surf Sci 602: L84-L88.

Tsivion et al., (2011) Guided growth of millimeter-long horizontal nanowires with controlled orientations. Science 333 (6045): 1003-1007.

Wagner et al., (1995) Formation and in situ modification of monolayers chemisorbed on ultraflat template-stripped gold surfaces. Langmuir 11: 3867-3875.

Yim et al., (2006) Universal Phenomena of CO Adsorption on Gold Surfaces with Low-Coordinated Sites. The Journal of Physical Chemistry C 111: 445-451.

Hermann K (2011) Ideal Single Crystal Surfaces. In: Crystallography and Surface Structure: An Introduction for Surface Scientists and Nanoscientists. Wiley-VCH Verlag & Co., KGaA, Germany; pp. 139-140.

Murphy et al., (2003) Layer-dependent reactivity in the Fe/Mo(110) epitaxial ultrathin film system. Physical Review B 68: 165419, 8 pages.

Naumann et al., (1997) Morphology of sputtering damage on Cu(111) studied by scanning tunneling microscopy. Surface Science 388: 212-219.

Database Inspec (Online), The Institution of Electrical Engineers, Stevenage, GB; Jul. 1997; Nakakura and Altman (1997) Comparison of bromine etching of polycrystalline and single crystal Cu surfaces. Journal of Vacuum Science & Technology A: Vacuum, Surfaces, and Films 15(4): 2359-2368.

\* cited by examiner

US 9,446,949 B2

VICINAL SURFACES OF POLYCRYSTALLINE STRUCTURES

FIELD OF THE INVENTION

The present invention relates to vicinal surfaces of polycrystalline metal or polycrystalline semiconductor materials, a method of preparation and use thereof in a variety of applications.

BACKGROUND OF THE INVENTION

Self-formation of well-arranged nanometric scale templates on solid surfaces has been extensively studied in recent years (C. Becker et al., *Topics in Current Chemistry* 287, 45 (2009)). This is mainly because these surfaces provide the advantage of forming well-defined and highly ordered nanostructures in scale lengths that are not feasible when conventional lithography techniques are used. Stepped surfaces with high uniformity and regularity can be obtained by the miscut of single crystals in a metal (S. Rousset et al., *Materials Science and Engineering: B* 96, 169 (2002)) or semiconductor (T. Christian, *Physics Reports* 365, 335 (2002)) via ion bombardment at a small angle to a plane of low surface energy and high symmetry. This produces high-index surfaces, which usually possess high surface energies. To lower the surface energy, the high-index surface is subjected to surface faceting in a periodic pattern upon annealing at high temperatures, thus revealing periodic single-atom high terraces of low-index planes. This process yields different periodicities, which can be obtained with terrace lengths ranging from several to hundreds of nanometers, and which are precisely controlled by the miscut angle. These faceted surfaces are widely referred to in the literature as "vicinal surfaces" and are extensively used in many different applications.

Vicinal surfaces of face-centered cubic (FCC) metals have found considerable use in microelectronic applications (C. Didiot et al., *Nat Nanotech* 2, 617 (2007)). These variant 2D lateral structures, composed of terraces and step edges, have characteristic position-dependent electronic states, and hence are known to form unique surface electronic wave functions (A. Mugarza et al., *Physical Review Letters* 87, (2001); J. E. Ortega et al., *Physical Review B* 65, 165413 (2002)). Atomic sites on a step edge have low coordination numbers and are thus far more reactive than atomic positions within a terrace. These surfaces are therefore ideal for use as prominent catalytic agents (W. L. Yim et al., *The Journal of Physical Chemistry C* 111, 445 (2006); Z. P. Liu et al., *Journal of the American Chemical Society* 124, 14770 (2002); F. Tao et al., *Science* 327, 850 (2010); M. S. Altman, *Science* 327, 789 (2010)), as nanostructured templates for directing nanowire arrays (U.S. Pat. No. 7,569,470; D. Tsivion et al., *Science* 333, 1003 (2011)), for patterning quantum dots and magnetic domains (U.S. Patent Application No. 2006/0202292; C. Didiot et al., *Nat Nano* 2, 617 (2007); S. Shiraki et al., *Applied Surface Science* 237, 284 (2004); J. V. Barth et al., *Nature* 437, 671 (2005); A. Tejeda et al., *Europhysics Letters* 71, 117 (2005)), and for assembling organic molecules such as self-assembled monolayers (N. Battaglini et al., *Langmuir* 24, 2042 (2008)), graphene (M. Treier et al., *Surf Sci* 602, L84 (2008)) and $C_{60}$ (J. Kröger et al., *J. Phys.: Condens. Matter* 18, S51 (2006)).

A drawback of the hitherto known process of forming vicinal surfaces, which prevents it from leading to any significant technological breakthrough, is the expensive, inflexible and limited use of single crystals as well as the need to perform these procedures under Ultra-High Vacuum (UHV) conditions. Novel methods for preparing vicinal-nanosteps that avoid the drawbacks of the prior art are highly desirable. It was not previously known that it is possible to form vicinal surfaces of single atom dimensions on a polycrystalline material.

SUMMARY OF THE INVENTION

The present invention provides vicinal surfaces on polycrystalline metal or polycrystalline semiconductor materials and a method of preparing same. The method comprises the deposition of a polycrystalline metal or polycrystalline semiconductor material on a substrate followed by removing the material from the substrate so as to expose a vicinal surface comprising terrace steps of atomic scale. The step of removing the material from the substrate may be preceded by annealing, preferably at low temperatures.

The present invention is based in part on the unexpected finding that vicinal surfaces comprising terrace steps of atomic scale can be formed on polycrystalline metal or polycrystalline semiconductor materials rather than being formed on single crystals. It was not previously realized that it is possible to form vicinal surfaces having terrace steps of atomic scale on a polycrystalline material.

Unexpectedly, the vicinal surfaces can be formed already at the growth stage without the need to perform a miscut or anneal under ultra-high vacuum or high temperatures. The formed surfaces exhibit characteristics similar to classical vicinal surfaces and are thus suitable for a variety of applications including microelectronics, catalysis, direction of nanowire arrays, patterning of nanostructures and magnetic domains and assembling of organic and inorganic molecules. Each possibility represents a separate embodiment of the present invention.

According to a first aspect, the present invention provides a polycrystalline material comprising at least one vicinal surface having stepped terraces comprising steps of atomic scale.

According to another aspect, the present invention provides a method of preparing a polycrystalline material comprising at least one vicinal surface having stepped terraces comprising steps of atomic scale, the method comprising the steps of:
a. depositing a polycrystalline material on a substrate;
b. optionally annealing the deposited polycrystalline material on the substrate obtained in step (a); and
c. removing the polycrystalline material obtained in step (a) or (b) from the substrate so as to expose a vicinal surface of the polycrystalline material having stepped terraces comprising steps of atomic scale.

In one embodiment, the polycrystalline material comprising at least one vicinal surface having stepped terraces comprising steps of atomic scale is prepared according to the method of the present invention.

In certain embodiments, the step of depositing a polycrystalline material on a substrate comprises the use of at least one technique selected from the group consisting of physical vapor deposition (PVD), chemical vapor deposition (CVD), liquid phase epitaxy, solid phase epitaxy, spin coating, dip-coating, screen printing, sol-gel printing, electrodeposition, electroless deposition, and electrophoretic deposition. Each possibility represents a separate embodiment of the present invention.

In one embodiment, the step of depositing a polycrystalline material on a substrate comprises the use of physical vapor deposition (PVD).

In various embodiments, the polycrystalline material of the present invention is in the form of a structure having a substantially flat architecture or a three-dimensional architecture. Each possibility represents a separate embodiment of the present invention.

In other embodiments, the polycrystalline material of the present invention is in the form of a polycrystalline film. In certain embodiments, the polycrystalline film is an ultra-flat polycrystalline film.

In further embodiments, the polycrystalline material comprises a metal or a metal alloy. In some embodiments, the metal or metal alloy is selected from the group consisting of Au, Ag, Pd, Ni, Co, Pt, Cu, Al, Ir, and an alloy thereof. Each possibility represents a separate embodiment of the present invention. In other embodiments, the metal or metal alloy is Mn, Fe or an alloy thereof. Each possibility represents a separate embodiment of the present invention. In one embodiment, the polycrystalline material comprises Au metal. In another embodiment, the polycrystalline material comprises Ag metal. In yet another embodiment, the polycrystalline material comprises Au alloy with a metal selected from the group consisting of Pd, Ag, Cu, Pt, and combinations thereof. Each possibility represents a separate embodiment of the present invention. In various embodiments, the polycrystalline material comprises a metal alloy selected from the group consisting of Au/Pd, Au/Ag, Au/Cu, Au/Ag/Cu, Au/Pt, Au/Ag/Cu/Pd, Pt/Rh, Ni/Co, Pt/Ni/Fe, Ir/Pt, Ir/Au, Ir/Pt/Au, and Ir/Pd. Each possibility represents a separate embodiment of the present invention. In other embodiments, the polycrystalline material comprises Au/Pd alloy.

In some embodiments, the polycrystalline material comprises a semiconductor selected from the group consisting of Si, $SiO_2$, $TiO_2$, $CeO_2$, $V_2O_5$, PbS, MN, $Si_3N_4$, InP, GaN, GaP, CdS, CdTe, CdZnTe, GaAs, InAs, InSb, ZnS, ZnSe, and ZnTe. Each possibility represents a separate embodiment of the present invention.

In further embodiments, the substrate comprises a substantially flat surface. In alternative embodiments, the substrate comprises a three-dimensional surface architecture. In particular embodiments, the substrate comprises a porous or mesoporous three-dimensional architecture. In some embodiments, the substrate is selected from the group consisting of $SiO_2$, $Al_2O_3$, MgO, $SrTiO_3$, ZnO, $GeO_2$, TiO, ZrO, $CeO_2$, $V_2O_5$, $CrO_3$, FeO, CuO, NiO, MnO, ZnO, $Re_2O_7$, $MoO_3$, $W_2O_3$, $Ta_2O_5$, $Nb_2O_5$ and $HfO_2$. Each possibility represents a separate embodiment of the present invention. In other embodiments, the substrate is selected from the group consisting of $Si_3N_4$, TiN, NaCl, CsI, NaBr, NaI, LiF, $BaF_2$, $BaTiO_3$, $CaCO_3$, $CaF_2$, $CdWO_4$, $LiNbO_3$, $LiTaO_3$, $LaF_3$, $MgAl_2O_4$, $MgF_2$, PbWO, $TeO_2$, and SiC. Each possibility represents a separate embodiment of the present invention. In certain embodiments, the substrate comprises $SiO_2$ in an amorphous or crystalline (quartz) form.

In one embodiment, the step of annealing is performed at low temperatures. In another embodiment, the step of annealing is performed at temperatures in the range of about 40-400° C. In an exemplary embodiment, the step of annealing is performed at temperatures above room temperature. In another exemplary embodiment, the step of annealing is performed at temperatures in the range of about 50-100° C. In yet another exemplary embodiment, the step of annealing is performed at temperatures in the range of about 100-200° C. In a further embodiment, the step of annealing is performed at temperatures in the range of about 200-400° C.

In some embodiments, the step of removing the polycrystalline material from the substrate comprises stripping the obtained structure from the substrate. In certain embodiments, the stripping comprises mechanical stripping or chemical stripping. Each possibility represents a separate embodiment of the present invention.

In additional embodiments, the mechanical stripping comprises gluing the material to a substance using an adhesive. In specific embodiments, the adhesive is selected from polymeric (e.g. epoxy) and ceramic (e.g. silicate) adhesive. Each possibility represents a separate embodiment of the present invention. In particular embodiments, the mechanical stripping comprises template stripping.

In some embodiments, the chemical stripping comprises the use of an organic solvent. In other embodiments, the solvent is selected from the group consisting of tetrahydrofuran (THF), N,N-dimethylformamide (DMF), dimethylsulfoxide (DMSO), pyridine, 2-picoline, 3-picoline, 1,4-dioxane, and mixtures thereof. Each possibility represents a separate embodiment of the present invention.

In alternative embodiments, the step of removing the polycrystalline material from the substrate comprises etching the substrate. In some embodiments, the etching comprises a chemical etching, a physical etching or a combination thereof. Each possibility represents a separate embodiment of the present invention.

In some embodiments, the vicinal surface having stepped terraces comprising steps of atomic scale has step periodicity in the range of about 1 nm to about 500 nm In particular embodiments, the step periodicity is in the range of about 1 nm to about 30 nm.

In various embodiments, the vicinal surface is misoriented with respect to the low energy plane by an angle ($\alpha$) ranging from about 0.01° to about 20°.

In certain embodiments, the vicinal surface of the present invention is functionalized. It will be recognized by one of skill in the art that the functionalization is performed to provide tailored chemical, electronic and mechanical properties of the vicinal surface according to the desired application. In some embodiments, the vicinal surface of the present invention is functionalized with at least one functional group selected from a thiol, a thiolate, a sulfide, a disulfide, a sulfite, a sulfate, a phosphate, a phosphine, an amine, a silane, a carboxylate and combinations and derivatives thereof. Each possibility represents a separate embodiment of the present invention.

According to yet another aspect, the present invention provides the use of a polycrystalline material comprising a vicinal surface having stepped terraces comprising steps of atomic scale for microelectronics, catalysis, direction of nanowire arrays, or patterning of quantum dots and magnetic domains. Each possibility represents a separate embodiment of the present invention. In certain embodiments, the polycrystalline material comprising a vicinal surface having stepped terraces comprising steps of atomic scale of the present invention is used for patterning of nanostructures.

In some embodiments, the vicinal surface having stepped terraces of the present invention is used for assembling organic and inorganic molecules. Each possibility represents a separate embodiment of the present invention. In other embodiments, the vicinal surface having stepped terraces of the present invention is used for controlling immobilization of ligands, proteins or cells. Each possibility represents a separate embodiment of the present invention.

Further embodiments and the full scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will be understood and appreciated more fully from the following detailed description taken in conjunction with the appended figures:

(FIG. 2A) An image (2 μm×2 μm) showing grains larger than 1 μm on average, the grains have an overall sub-nanometric RMS of 0.8 nm; The inset shows a higher 3D magnification of one of the grains revealing a faceted surface. (FIG. 2B) Schematic illustration of the vicinal-surface-like atomic steps. $\alpha_i$ is the angle of misorientation of the vicinal surface from the low energy {111} plane. The arrow on a terrace of each grain indicates the <111> direction. It can be seen that a higher misorientation angle results in a denser structure. $L_i$ is the average periodicity of steps. (FIGS. 2C-2D) Images from two adjacent grains revealing different average periodicities of steps. A line profile below each image demonstrates the different uniform terrace lengths. (FIG. 2E) Left: Four adjacent grains, denoted G1-G4, and higher magnifications of each individual grain (right). Each adjacent grain has a distinct atomic step direction attributed to different in-plane grain orientations.

(FIG. 4A) Graphic scheme presenting the variations in in-plane and out-of-plane directions of Au grains on top of three different $SiO_2$ substrates. Arrows indicate the <111> direction of the grains (hexagonal shapes), whereas white stripes across the grains represent the terrace orientation of each grain. On the amorphous silica, the in-plane orientations between grains are arbitrary (powder-like), while the quartz crystal exhibiting 3-fold symmetry imparts its symmetry to the Au grains over-layer. These grains are thus better oriented in-plane with respect to each other. The Au misorientation angles show, on average, a decrease with increasing substrate orientation in relation to the 3-fold axis, and the average Au atomic step periodicity increases accordingly. (FIG. 4B) STM images of stripped gold surfaces from different $SiO_2$ substrates. Panels 1a-1b: in-grain and grain boundary images of Au surface stripped from substrate (i), respectively; Panels 2a-2b: in-grain and grain boundary images of Au surface stripped from substrate (ii), respectively; Panel 3a: in-grain image of Au surface stripped from substrate (iii).

(FIGS. 5A-5B) after annealing of dense atomic step surfaces at 250° C. for 4 hours. (FIG. 5B) 70 nm×70 nm image reveals high ordering of the atomic steps (probably step roughening or bunching, as described for classical vicinal surfaces); (FIG. 5C) upper and lower, annealing of low-density atomic step surfaces at 310° C. for 4 hours reveals the co-existence of large steps and herringbone surface reconstruction. Lines of reconstruction are parallel (upper) and perpendicular (lower) to the step edge.

(FIG. 9A) steps in Au stripped from amorphous $SiO_2$. Arrows point to continuous steps, crossing an area of defect lines. (FIG. 9B) steps on Au (20% wt.)-Pd alloy. The fault lines appear as rectangular shapes (S. Borukhin et al., *Langmuir* 27, 13415 (2011)) passing through the existing steps.

(FIG. 10B) a high magnification image of the rectangular area of FIG. 10A. The SAM molecules appear as white dot, and are located mostly at the counters of the step edges.

(FIG. 11A) STM image of a stepped gold sample, immersed in 10 mM cysteine in aqueous solution (milliQ) for 20 minutes, and heated to 110° C. for several hours. The cysteine molecules are seen as white dots, located mostly at step edges. Dark dotes (holes) are located mostly at central terrace areas. (FIG. 11B) Two line scans (1 and 2) which are marked in FIG. 11A: Line 1—a line scan across a cysteine particle or several grouped particles having a typical height of about 1 nm, attached to step edge; Line 2—a line scan across a hole which correlates with 1-2 monolayers in depth.

(FIG. 12C) is a high magnification image of FIG. 12B. (FIG. 12D) a line profile which is marked in FIG. 12C, showing the dimensions of adsorbed cysteine molecules (typically less than 1 nm in height).

(FIGS. 14A, 14C and 14D) images from three different surface areas of the sample. (FIG. 14B) the current image of FIG. 14A, showing Hg branches which initiate at the steps.

(FIGS. 15B and 15C) higher magnification images of the rectangular area of FIG. 15A. (FIG. 15D) a line scan of three steps which is marked in FIG. 15C showing thicker edges of steps 2 and 3, where clusters of Hg or Hg—Au intermetallics are clearly seen on step edges or in their vicinity.

(FIG. 16A) samples were annealed for 4 hours. (FIGS. 16C and 16D) samples were annealed overnight.

(FIG. 16B) Line scans of different heights across a terrace. The line scans are marked in FIG. 16A: Lines 1 and 2: line scan across a step edge; Lines 3 and 4: line scans across a flat area inside the terrace. The cloud-like substance decreases in thickness further away from the step edge into inner terrace areas.

DETAILED DESCRIPTION OF THE INVENTION

Figure 1:
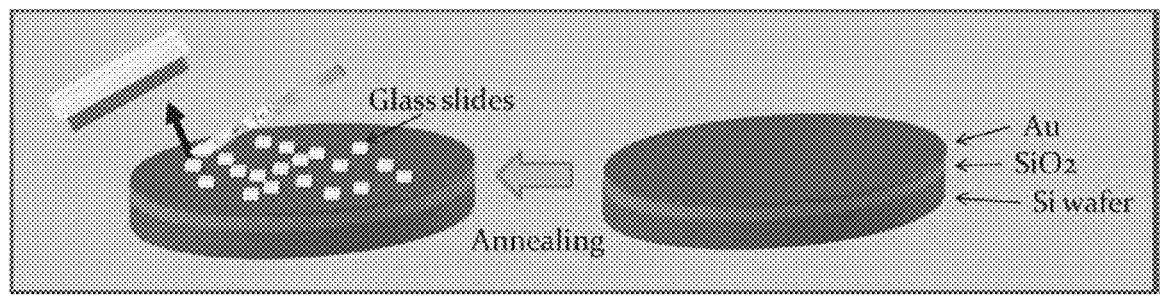
FIG. 1: Scheme of sample preparation. A thin Au film is deposited on a thick $SiO_2$ layer thermally oxidized on top of a Si wafer. The $Au/SiO_2$/Si is then annealed for several hours in air in an oven at a constant temperature in the range of 200-400° C. After annealing, glass slides are glued on top using a polymeric or ceramic adhesive. The gold layer attached to the slide is then gently peeled off (stripped), exposing a clean, ultra-flat surface of micrometric grains, each of which exhibits vicinal-surface-like atomic steps.

The present invention demonstrates for the first time a method of forming self-ordered vicinal surfaces having nanosteps on polycrystalline materials without performing a miscut or using UHV conditions. The method comprises the deposition of a polycrystalline material on a substrate followed by the removal of the polycrystalline material from the substrate so as to expose a vicinal surface having stepped terraces formed at the interface between the polycrystalline material and the substrate. In some embodiments, the removal of the polycrystalline material is preceded by annealing of the material-substrate sandwich, preferably at low-temperatures. The method provided herein allows for the versatile and inexpensive integration of such surfaces into a variety of technological applications.

Stepped surfaces which are characterized by ordered nanometric structures were shown to have great potential for advanced technological applications, particularly due to their enhanced and unique magnetic, catalytic and electronic properties (T. Christoph, *Journal of Physics: Condensed Matter* 21, 013002 (2009); R. A. Hyman et al., *Physical Review B* 58, 9276 (1998); F. Tao et al., *Science* 327, 850 (2010); M. S. Altman, *Science* 327, 789 (2010); C. Didiot et al., *Nat Nanotech* 2, 617 (2007)). The step edges are essentially defect sites that are surrounded by few near neighboring atoms and are thus far more reactive than sites on a flat terrace. Consequently, these edges readily attract molecules from the surrounding ambient. Vicinal surfaces, which have a high concentration of such energetically favored surface sites are studied as nanotemplates for selective self-assembly of adsorbents such as organic molecules or metal clusters that form secondary structures on top of the vicinal surfaces. It was shown that the properties of step edges, as well as of clusters adsorbed thereto are vastly enhanced. For instance, a high concentration of steps increased the activity of CO oxidation processes thus enabling them to be performed at low temperatures (Z. P. Liu et al., *JACS* 124, 14770 (2002); G. Bond et al., *Gold Bull* 33, 4 (2000)) which has applications in next generation automobile catalysis. Another study showed that atomic clusters of metals at step edges of Pt vicinal electrode surface enhance its catalytic activity (H. Massong et al., *Electrochimica Acta* 46, 701 (2001)). 1D clusters of transition metals formed at the edges of vicinal surfaces of Cu, Pt, Au and other metals have been studied for the development of high-density magnetic recording devices (H. Hashemi et al., *Physical Review B* 81, 104418 (2010); P. Gambardella et al., *Nature* 416, 301 (2002); S. Shiraki et al., *Applied Surface Science* 237, 284 (2004)). Due to step edge activation, the small domains possess high local magnetic moments.

The polycrystalline surfaces with the atomic scale nanosteps of the present invention are useful as prominent catalytic agents, as nanostructured templates for directing nanowire arrays, for patterning quantum dots and magnetic domains and for assembling organic and inorganic molecules. The vicinal surfaces of the present invention may also be used for patterning of nanostructures including, but not limited to nanoislands, nanorods, nanocubes and the like. Each possibility represents a separate embodiment of the present invention. The vicinal surfaces of the present invention attract, adsorb and strongly bind metals as well as organic molecules in a manner similar to that of vicinal surfaces of single crystals.

For a better understanding of the invention and to show how it may be carried into effect, reference will now be made, purely by way of example, to the accompanying drawings. With specific reference now to the drawings in detail, it is stressed that the particulars shown are by way of example and for purposes of illustrative discussion of the preferred embodiments of the present invention only, and are presented with the purpose of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice.

FIG. 1 shows a schematic representation which demonstrates one non-limiting manner in which the method of the present invention can be implemented. In this example, a silicon wafer is thermally oxidized to form a thick silicon dioxide layer, on top of which a thin (about 5 nm to about 1 µm) Au film is deposited. The Au/SiO$_2$/Si sandwich is then annealed at low temperatures (about 200-400° C.). It will be recognized by one of skill in the art that the annealing step is optional to better control the ordering of the formed stepped terraces. A glass slide is then glued on top of the Au/SiO$_2$/Si sandwich using a polymeric or ceramic adhesive. The gold layer attached to the slide is then gently peeled off (stripped) to expose ultra-flat surface of micrometric grains each of which comprising terrace steps of atomic scale.

The present invention thus provides a method of forming a polycrystalline material comprising a vicinal surface having stepped terraces. The method comprises the deposition of a polycrystalline material on the surface of a materially different substrate followed by the removal of the formed structure from the substrate so as to expose the stepped terraces which are formed at the interface between the deposited material and the substrate. An optional step of annealing the material and substrate prior to the removal of the material from the substrate may be performed according to the principles of the present invention.

The present invention further provides a polycrystalline material comprising at least one vicinal surface having stepped terraces. The term "vicinal surface having stepped terraces" as used herein refers to a surface which is characterized by a plurality of substantially flat areas, called terraces, with rising or descending steps in between these areas, called terrace steps. In one embodiment, the polycrystalline material comprising a vicinal surface having stepped terraces is prepared according to the method of the present invention.

According to the principles of the present invention, the polycrystalline material comprising a vicinal surface having stepped terraces has a structure which may be substantially flat or alternatively possess a three-dimensional architecture. Each possibility represents a separate embodiment of the present invention.

The polycrystalline material comprising at least one vicinal surface comprises a metal, a metal alloy, a semiconductor or combinations thereof. Each possibility represents a separate embodiment of the present invention. Suitable metals include, but are not limited to, Au, Ag, Pd, Ni, Co, Pt, Cu, Al, Ir, Mn, Fe and their alloys including, but not limited to, Au/Pd, Au/Ag, Au/Cu, Au/Ag/Cu, Au/Pt, Au/Ag/Cu/Pd, Pt/Rh, Ni/Co, Pt/Ni/Fe, Ir/Pt, Ir/Au, Ir/Pt/Au, and Ir/Pd. Each possibility represents a separate embodiment of the present invention. Specific examples of metals or metal alloys include, but are not limited to, Au, Ag or Au/Pd alloys comprising varying percentages (e.g. 20 wt. %) of gold. Suitable semiconductors or oxide-based materials include, but are not limited to, Si, $SiO_2$, $TiO_2$, $CeO_2$, $V_2O_5$, PbS, MN, $Si_3N_4$, InP, GaN, GaP, CdS, CdTe, CdZnTe, GaAs, InAs, InSb, ZnS, ZnSe, and ZnTe. Each possibility represents a separate embodiment of the present invention.

The deposition of polycrystalline material on a substrate can be performed as is known in the art. Suitable techniques for deposition include, but are not limited to, physical vapor deposition (PVD), chemical vapor deposition (CVD), liquid phase epitaxy, solid phase epitaxy, spin coating, dip-coating, screen printing, sol-gel printing, electrodeposition, electroless deposition and electrophoretic deposition. Each possibility represents a separate embodiment of the present invention.

According to the principles of the present invention, physical vapor deposition (PVD) comprises at least one of the following:
  thermal evaporation using a hot material in vacuum.
  sputtering using inert plasma which is sputtered on the substrate.
  molecular beam epitaxy using atomic streams that contain the material to be deposited. The substrate is heated and placed in high vacuum where the atomic streams impinge on its surface. This method provides coating layers with thicknesses in the range of up to a few nanometers.
  laser ablation deposition using an intense laser radiation to erode a target and deposit the eroded material on the substrate. This technique is useful for thin coating.

Chemical Vapor Deposition (CVD) comprises the use of a vapor phase (usually diluted with an inert gas carrier), which chemically reacts on the surface of a substrate to deposit a solid film. Various CVD techniques include, but are not limited to, atmospheric pressure CVD, low-pressure CVD/very low pressure CVD, metaloorganic CVD, and plasma enhanced CVD. Each possibility represents a separate embodiment of the present invention.

Liquid Phase Epitaxy (LPE) comprises the growth of crystal films from a melt on a designated substrate material. The growing crystalline layer has a geometrical registry of atoms as compared to the underlying substrate materials, namely an epitaxial match.

Solid Phase Epitaxy (SPE) comprises the deposition of a thin amorphous layer on a crystalline substrate material followed by crystallization induced by heating. As in the LPE technique, an epitaxial relation occurs between the deposited crystalline film and the substrate material.

Spin coating comprises the deposition of thin layers of materials on a substrate using a liquid precursor and rotating at high-speed. The rotation at high-speed provides the spreading of the liquid precursor materials via centrifugal forces.

Dip-coating comprises dipping a substrate in a liquid precursor and pulling the substrate from the liquid at a constant velocity. Usually the solvent evaporates and a thin film of the desired material remains on the surface of the substrate.

Electrodeposition (electroplating) comprises the reduction of ions from solution and their deposition onto a substrate that operates as an electrode.

Electrophoretic deposition comprises the deposition of small particles and clusters of a material onto a substrate driven by an electric field.

Electroless deposition comprises the deposition of small particles and clusters of a material onto a substrate using a reducing agent in solution which reacts with the ions to be deposited.

The substrate material may be selected according to desired properties (e.g.

rigidity) provided that the substrate material does not react with the deposited film. It will be appreciated by one of skill in the art that that the substrate material is distinct from the material which forms the structure. In some embodiments, the substrate comprises a substantially flat surface. The surface can be polished (typically to a roughness of less than several nanometers) prior to its use as is known in the art. In accordance with these embodiments, the deposited structure is a polycrystalline film, for example an ultra-flat polycrystalline film. The term "ultra-flat" as used herein refers to a thin film which is characterized by a root mean square (RMS) roughness of less than about 10 nm. Preferably, the film is characterized by a root mean square (RMS) roughness of less than about 5 nm More preferably, the film is characterized by a root mean square (RMS) roughness of less than about 1 nm The term "film", as used herein, corresponds to a configuration of well-arranged assembly of particles, e.g. gold nanoparticles in body centered cubic (BCC) or face centered cubic (FCC) configuration.

The polycrystalline film, as disclosed herein comprises grains in sizes which range from about 0.1 μm to about 10 μm. The stepped terraces on each grain are characterized by their periodicity which, according to the principles of the present invention, can be controlled. The term "periodicity of steps" as used herein refers to the average width of the terraces within each grain. Within the scope of the present invention are step periodicities in the range of about 1 nm (nanometer) to about 500 nm. Exemplary step periodicities range from about 1 nm to about 30 nm. According to the principles of the present invention, the terrace steps are of atomic scale. The term "terrace steps of atomic scale" as used herein refers to steps having a height which ranges from about 1 Ångstrom to several (2-6) Ångstroms. According to the principles of the present invention, the vicinal surface is misoriented with respect to the low energy plane (e.g. the {111} plane of gold) by an angle (α; termed the angle of misorientation) ranging from about 0.01° to about 20°.

In other embodiments, the substrate comprises a three-dimensional surface architecture, for example a porous or mesoporous architecture. In accordance with these embodiments, the deposited structure may possess different forms and shapes.

Suitable substrate materials include, but are not limited to $SiO_2$, $Al_2O_3$, MgO, $SrTiO_3$, ZnO, $GeO_2$, TiO, ZrO, $CeO_2$, $V_2O_5$, $CrO_3$, FeO, CuO, NiO, MnO, ZnO, $Re_2O_7$, $MoO_3$, $W_2O_3$, $Ta_2O_5$, $Nb_2O_5$ and $HfO_2$. Each possibility represents a separate embodiment of the present invention. Other suitable substrate materials within the scope of the present invention include, but are not limited to $Si_3N_4$, TiN, NaCl, CsI, NaBr, NaI, LiF, $BaF_2$, $BaTiO_3$, $CaCO_3$, $CaF_2$, $CdWO_4$, $LiNbO_3$, $LiTaO_3$, $LaF_3$, $MgAl_2O_4$, $MgF_2$, PbWO, $TeO_2$, and SiC. Each possibility represents a separate embodiment of the present invention. Specific examples include $SiO_2$ substrates (e.g. amorphous $SiO_2$, quartz).

According to the principles of the present invention, the formed structure-substrate sandwich can be annealed for a time and temperature sufficient to obtain vicinal surfaces of desired area. The temperature for annealing can be determined by one of skill in the art in accordance with the melting temperature of the polycrystalline material forming the structure. In some embodiments, the temperature for annealing is calculated as 0.1-0.6 times the melting temperature of the polycrystalline material in degrees Kelvin. In one embodiment, the step of annealing is performed at low temperatures, namely at temperatures above room temperatures (e.g. 30-50° C.). In other embodiments, the annealing is performed at temperatures in the range of about 50-100° C., in the range of about 100-200° C. or in the range of about 200-400° C. Each possibility represents a separate embodiment of the present invention. The time period for annealing can be determined by one of skill in the art. Typical annealing time periods range from about 30 minutes to about several (e.g. 2-10) hours. The time and temperature for annealing can be determined by one of skill in the art so as to obtain a structure comprising at least one vicinal surface having well-ordered stepped terraces, the vicinal surface extends through a desired area, for example at least 10%, 20%, 30%, 40%, 50%, 60%, 70%, 80%, or 90% of the surface area of each grain. Each possibility represents a separate embodiment of the present invention. In some embodiments, the vicinal surface extends through at least 95% of the surface area of each grain thus providing a polycrystalline material comprising at least one vicinal surface having stepped terraces, wherein the stepped terraces substantially span the entire surface area of the structure that has been attached to the substrate.

The removal of the polycrystalline material from the substrate can be performed as is known in the art. Suitable techniques include, but are not limited to, stripping and etching. Each possibility represents a separate embodiment of the present invention. It will be appreciated by one of skill in the art that the technique for the removal of the material from the substrate is selected according to the architecture of the substrate and formed structure. Thus, it is contemplated that stripping is more suitable for removing a polycrystalline film from a substantially flat substrate whereas etching is more suitable for removing a polycrystalline structure from a substrate having a three-dimensional architecture. The stripping of the polycrystalline film from the substrate can be performed using mechanical stripping or chemical stripping. Each possibility represents a separate embodiment of the present invention. Suitable mechanical stripping includes the use of a substance (e.g. glass slide, Si wafer, polyethylene or polypropylene slide) onto which the film is glued using a polymeric adhesive (e.g. epoxy, urethane, cyanoacrylate and methacrylate), a ceramic adhesive (e.g. silicate) or any other adhesive known to those of skill in the art (e.g. self-assembled-monolayer (SAM) adhesive). Each possibility represents a separate embodiment of the present invention. The film is then peeled off together with the substance to which it is glued. It will be appreciated by one of skill in the art that the substance to which the film is glued provides a mechanical support for detaching the film from the substrate. A specific example for mechanical stripping includes template stripping as is known in the art.

Another stripping technique within the scope of the present invention is chemical stripping which utilizes an organic solvent or mixtures thereof to afford the detachment of the film from the substrate. Suitable solvents include, but are not limited to, tetrahydrofuran (THF), N,N-dimethylformamide (DMF), dimethylsulfoxide (DMSO), pyridine, 2-picoline, 3-picoline, 1,4-dioxane and mixtures thereof. Each possibility represents a separate embodiment of the present invention.

Removal of the polycrystalline material from the substrate can be performed using etching (e.g. chemical etching, physical etching or a combination thereof) of the substrate as is known in the art. Chemical etching can be performed using an acid reagent (e.g. phosphoric acid and hydrofluoric acid) or a base (e.g. potassium hydroxide and sodium hydroxide). Each possibility represents a separate embodiment of the present invention.

It will be recognized by one of skill in the art that the reagent for chemical etching is selected according to the substance to be etched. For example, phosphoric acid is suitable for etching silicon nitride, hydrofluoric acid is suitable for etching silicon dioxide and potassium hydroxide is suitable for etching silicon. It will be appreciated by one of skill in the art that the reagent for chemical etching affords the selective etching of the substrate to avoid any damage to the formed polycrystalline structure.

Physical etching can be performed using Ar, Xe or $O_2$ plasma. Each possibility represents a separate embodiment of the present invention. The combination of physical and chemical etching may be performed using $SF_6$, $CHF_3$ or $C_4F_8$ plasma. Each possibility represents a separate embodiment of the present invention. It will be recognized by one of skill in the art that the plasma used for physical etching or the combination of physical and chemical etching is selected according to the substance to be etched. It will be appreciated by one of skill in the art that the plasma for physical etching affords the selective etching of the substrate to avoid any damage to the formed polycrystalline structure.

The polycrystalline surfaces having atomic scale nanosteps of the present invention find utility in a variety of applications, including but not limited to catalysis, applications based on surface chemistry, electronic applications, applications based on thin magnetic domains, nano-dots, soft lithography and nano-island on metal surfaces. Each possibility represents a separate embodiment of the present invention.

The polycrystalline surfaces having atomic scale nanosteps of the present invention can be used to adsorb metal atoms which may be evaporated onto the surfaces to form 1D structures. The adsorption may be performed in a selective manner on reactive sites at the step edges. Within the scope of the present invention is the adsorption of metals at low rates using techniques such, but not limited to e-beam evaporation. The thus obtained 1D structures possess enhanced magnetic and electronic properties at the surface. The surfaces of the present invention may further be used for controlling the assembly of organic and biological molecules for various applications including, but not limited to hybrid technologies as described in e.g. M. Sarikaya et al., *Nat Mater* 2, 577 (2003). In some embodiments, the polycrystalline surfaces having atomic scale nanosteps of the present invention may be used to bind organic molecules. In some particular embodiments, the surfaces of the present invention are functionalized thereby providing tailored chemical, electronic and mechanical properties suitable according to the desired application. Suitable functional groups within the scope of the present invention include, but are not limited to, a thiol, a thiolate, a sulfide, a disulfide, a sulfite, a sulfate, a phosphate, a phosphine, an amine, a silane, a carboxylate and combinations and derivatives thereof. Each possibility represents a separate embodiment of the present invention.

In further embodiments, the surfaces of the present invention are used as nanotemplated inorganic surfaces for controlled immobilization of ligands, proteins and cells as described in e.g. M. Mrksich, *Current Opinion in Chemical Biology* 6, 794 (2002), suitable for bio-technological applications as well as analytical biology. In certain embodiments, the vicinal surfaces of polycrystalline materials of the present invention are used for attracting and binding with high affinity various biological molecules, particularly at low energy sites.

As used herein and in the appended claims the singular forms "a", "an," and "the" include plural references unless the content clearly dictates otherwise. Thus, for example, reference to "a vicinal surface" includes a plurality of such surfaces and equivalents thereof known to those skilled in the art, and so forth. It should be noted that the term "and" or the term "or" is generally employed in its sense including "and/or" unless the content clearly dictates otherwise.

The principles of the invention are demonstrated by means of the following non-limiting examples.

EXAMPLES

Example 1

Materials and Methods

Thin polycrystalline Au films (100 nm or 500 nm) were deposited directly on top of a thick (200 nm) $SiO_2$ layer of thermally oxidized (001) Si wafers. Gold film (99.99% pure, Sigma-Aldrich) was evaporated onto the $SiO_2$ substrate using an e-beam-equipped Airco Temescal FC-1800 evaporating system under a high vacuum of $10^{-7}$ torr, at room temperatures, yielding normal deposition rates of 10-12 Å/sec. No adhesion layer between the gold film and the $SiO_2$ substrate was used in the deposition process. The film-substrate was then annealed in an MRC ELF-11 laboratory oven at a constant temperature in the range of 200-400° C. for several hours under atmospheric pressure and environment. The Au film was then separated from the substrate by the template stripping (TS) technique (M. Hegner et al., *Surf Sci* 291, 39 (1993)). The TS method provides thin ultra-flat metal film surfaces by detaching a pre-deposited thin film of a metal from a polished wafer. The stripping was performed by attaching a glass slide to the top surface of the film with a Norland optical adhesive (NOA 61 ultraviolet curing adhesive) or a ceramic adhesive (a silicate adhesive from Omega). The slides served as mechanical supports for detaching the Au layers, as schematically shown in FIG. 1. The purity of the films, as well as that of the stripped surface, was verified by X-ray photoelectron spectroscopy (XPS).

Equipment

Scanning Tunneling Microscopy

Scanning tunneling microscopy (STM) was carried out in an Omicron variable temperature, ultra-high-vacuum system with a vacuum of $4 \times 10^{-1}$ Torr. A tungsten tip conditioned by electron bombardment was used for the measurements. Samples were attached to the sample holder with a double-sided Cu film, which also served as an electrical contact. STM images were obtained by application of a bias voltage of 1.2 V and a set-point current of 1.50 nA to the sample, and adjustment of a feedback loop to maintain a constant current.

High Resolution X-Ray Diffraction

High resolution X-ray diffraction (HR-XRD) spectra were obtained by the use of a Rigaku SmartLab diffractometer, which utilizes a rotating anode X-ray generator with a Cu target as a beam source, operated at 9 kW (45 kV, 200 mA). High resolution rocking curve measurements were obtained by a scintillation detector, a parallel beam multilayer mirror, and a 2× Ge (220) channel-cut monochromator.

X-Ray Photoelectron Spectroscopy

Film purity was verified by the element chemical bonding technique of X-ray photoelectron spectroscopy (XPS), with the aid of a Thermo-VG Sigma probe.

Image Data Processing and Data Analysis

Figure 6:
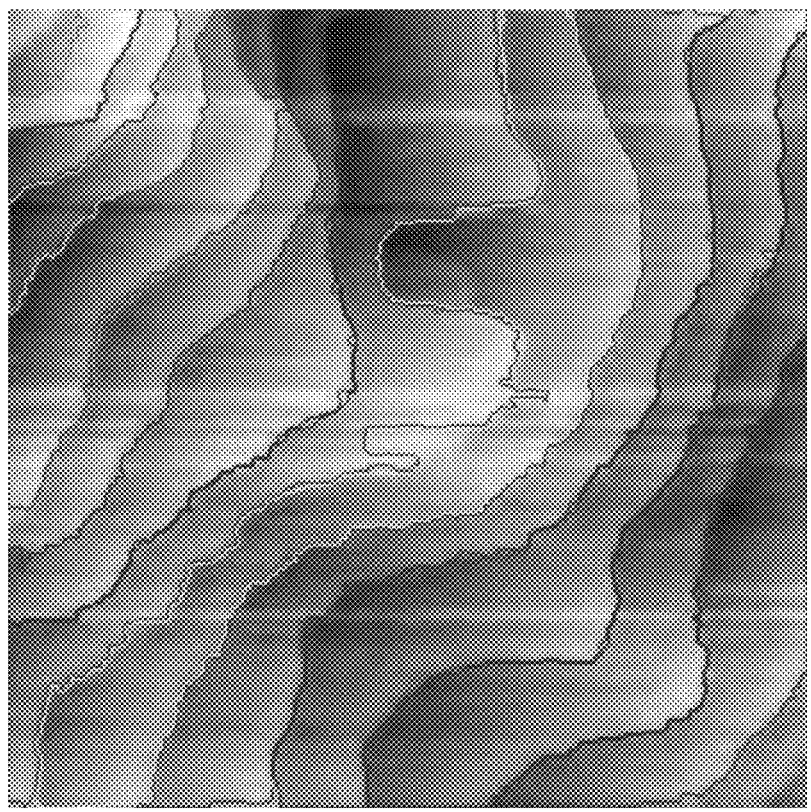
FIG. 6: Terrace shape detection of the Scanning Tunneling Microscopy (STM) data of the image shown in FIG. 2D, obtained using the grain analysis module of the SPIP software.

Processing of the STM raw data, as well as calculations of roughness and terrace lengths, were performed with Image Metrology's Scan Probe Image Processor (SPIP) software. Terrace shape parameters were obtained with the aid of the grain analysis module (FIG. 6), and in-grain statistics of average terrace length and size distribution were calculated.

X-Ray Diffraction Measurements of the Gold Surfaces

XRD measurements were obtained by means of the rocking curve procedure, which yields the average misorientations of the grains obtained from the entire film thickness. The average misorientation values, as determined according to the peak Full Width at Half Maximum (FWHM) for the substrates (i) amorphous $SiO_2$, (ii) 3° miscut basal plane quartz, and (iii) almost perfectly cut basal quartz substrates, were 6.93°, 4.92° and 4.2°, respectively.

Example 2

Formation of Stepped Vicinal Surfaces on Polycrystalline Au Ultra-thin Film

A thin polycrystalline Au film was deposited on top of a $SiO_2$ layer of thermally oxidized (001) Si wafer as described in Example 1. The film was then separated from the substrate by the template stripping (TS) technique (M. Hegner et al., *Surf Sci* 291, 39 (1993); P. Wagner et al., *Langmuir* 11, 3867 (1995); L. Chai et al., *Langmuir* 23, 7777 (2007); J. Blackstock, *Surf Sci* 546, 87 (2003)). Stepped vicinal-like surfaces were observed. The stripped surface was characterized by high-resolution UHV scanning tunneling microscopy (STM). The metal surface that was intact with the substrate demonstrates ultra-flat characteristics with a root mean square (RMS) roughness of <1 nm. To achieve such surfaces with a larger grain size than that attained as deposited at room temperatures (typically ~20 nm for gold), low-temperature annealing (200-400° C.) was performed prior to stripping (S. Borukhin et al., *Langmuir* 27, 13415 (2011); FIG. 1). STM revealed that the stripped surfaces of thin gold films, which were deposited on thick amorphous $SiO_2$ grown on silicon wafers, exhibited ultra-flat Au grains that were, on average, more than 1 μm in size (S. Borukhin et al., *Langmuir* 27, 13415 (2011)).

Figure 2A:
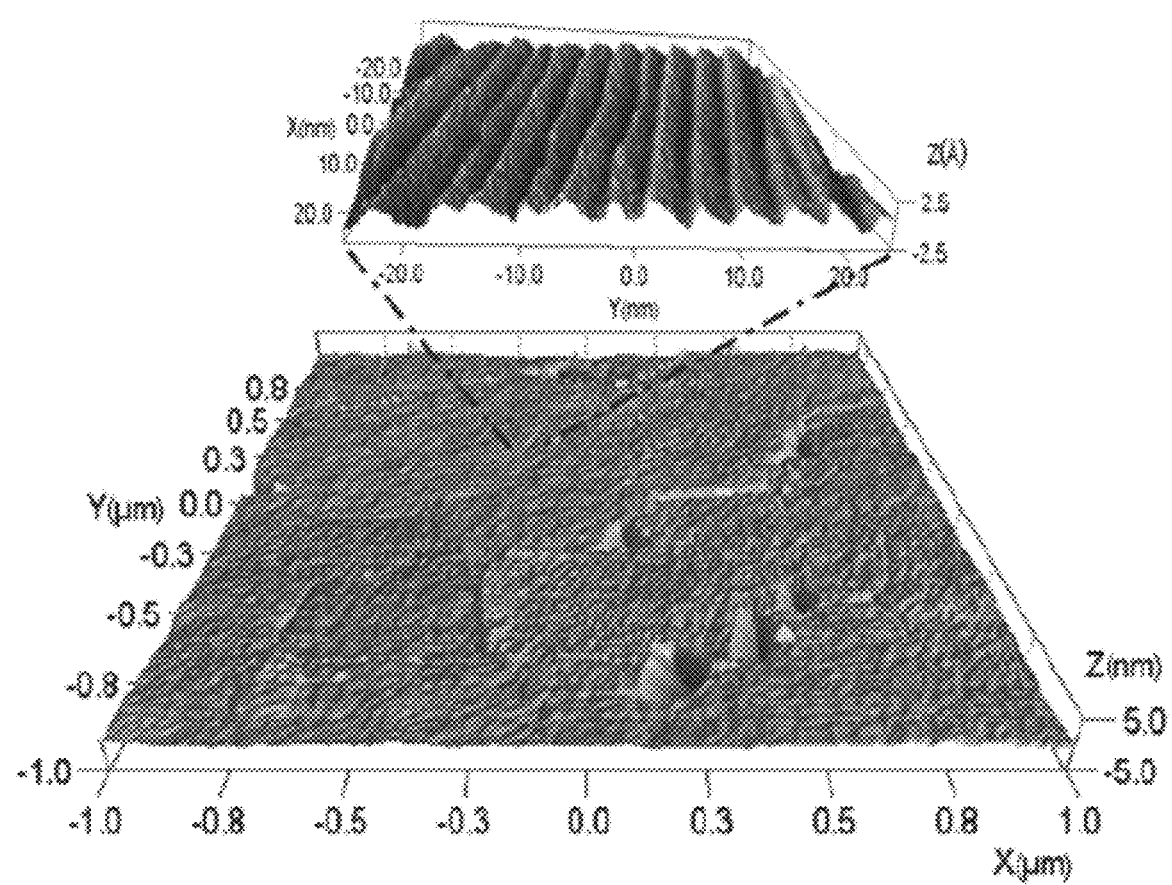
FIGS. 2A-2E: Scanning Tunneling Microscopy (STM) images of stripped gold surfaces from $SiO_2$ substrates. The thin gold films were annealed at low temperatures prior to template stripping (TS).
Figure 2B:
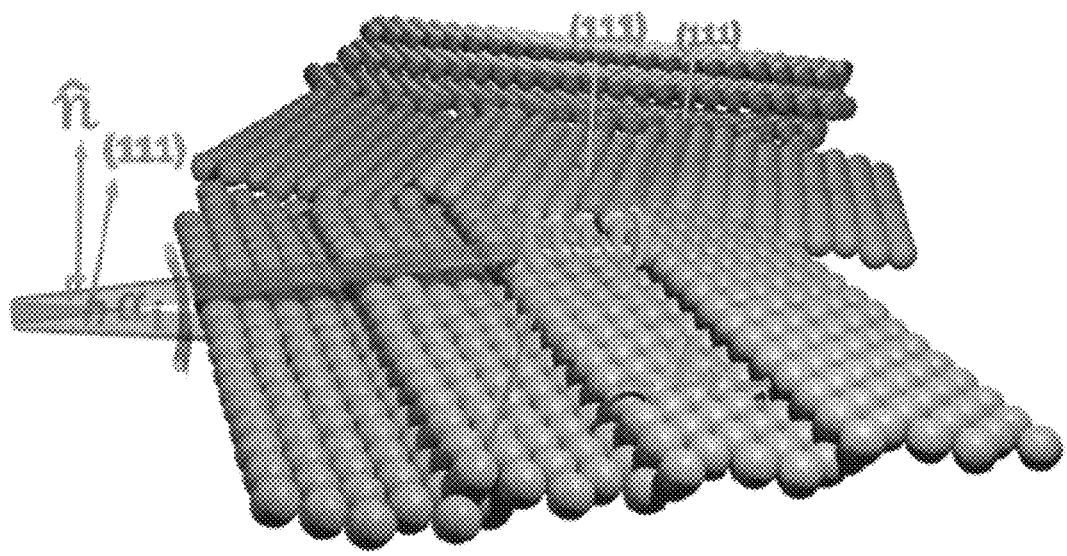
Figure 2C:
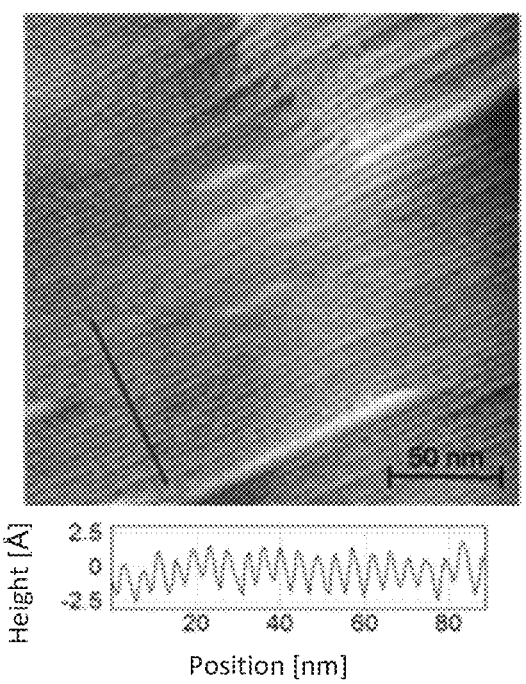
Figure 2D:
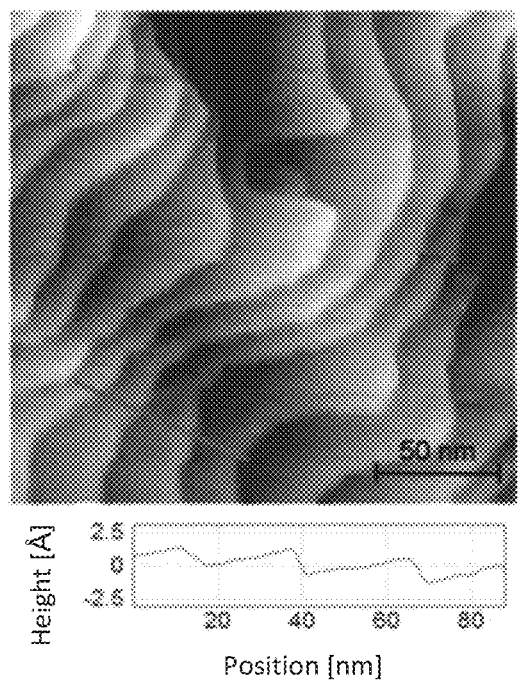
Figure 2E:
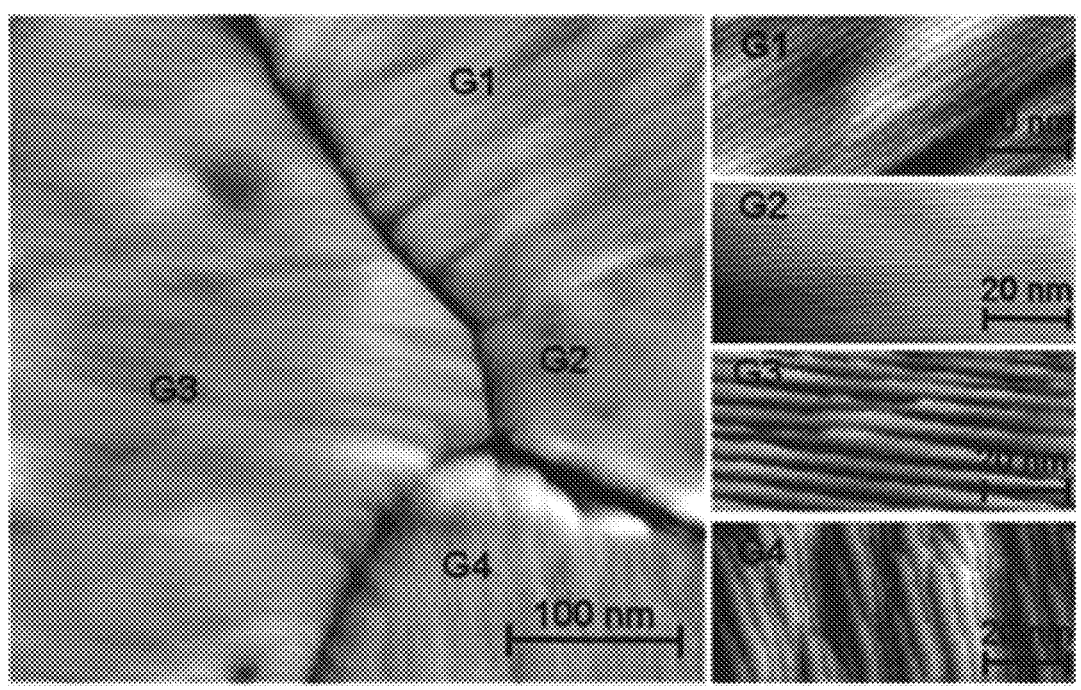
Figure 7A:
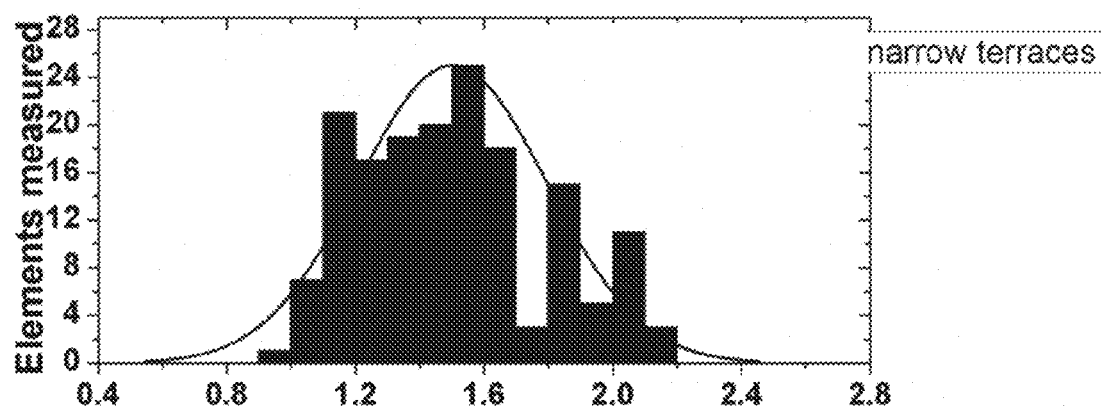
FIGS. 7A-7B: Grain analysis results obtained for the gold-stripped surface images shown in FIGS. 2C and 2D, respectively. Calculated terrace lengths are shown for each grain.
Figure 7B:
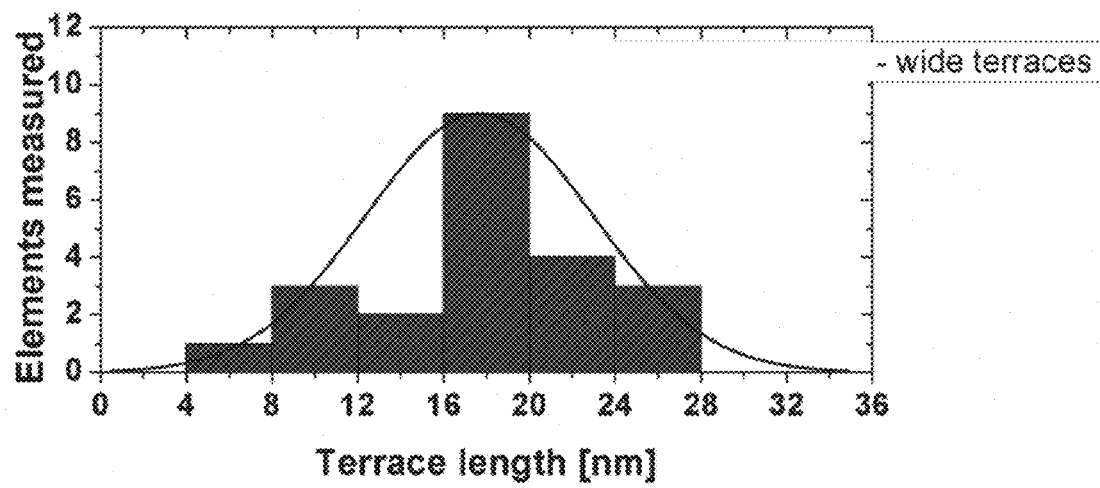

Surprisingly, when STM was performed at higher magnifications, periodic atomic steps were observed throughout all the grains (FIG. 2A and as schematically demonstrated in FIG. 2B). Each grain demonstrated a different periodicity (FIGS. 2C and 2D; FIGS. 7A and 7B) and a different relative direction of atomic steps (FIG. 2E). Within a single grain, however, these characteristics were uniform with a narrow distribution comparable to that observed in classical vicinal surfaces (S. Rousset et al., *Journal of Physics: Condensed Matter* 15, 53363 (2003)).

Image process analysis performed on the full in-grain images (FIGS. 2C and 2D) revealed that the average periodicities of steps (terrace width, $L_t$) in the two different grains were $L_1$=1.5 nm±0.3 nm and $L_2$=17.7 nm±5.3 nm. Furthermore, the average atomic step height was 2-3 Å, which corresponds to a single atomic step.

Example 3

Stepped Vicinal Surfaces on Different Polycrystalline Metallic Films

Figure 3A:
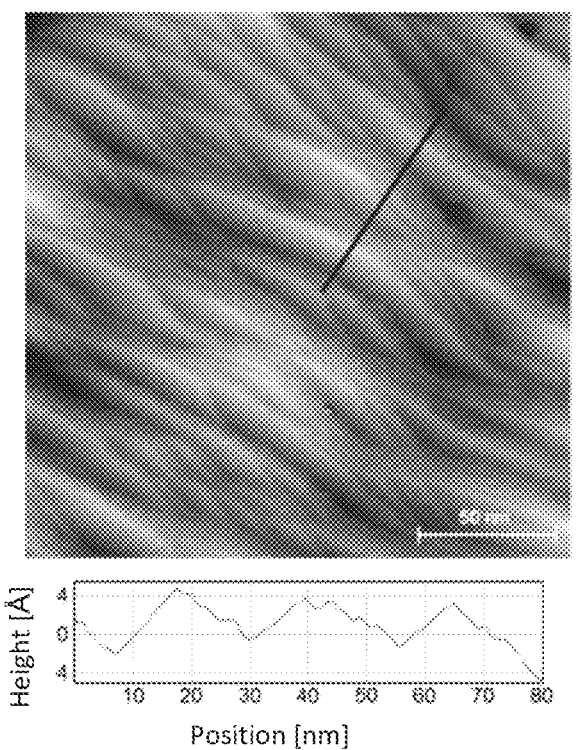
FIGS. 3A-3B: Scanning Tunneling Microscopy (STM) images showing the post-annealed stepped surfaces of template-stripped FCC metallic thin films of (FIG. 3A) Ag and (FIG. 3B) Au/Pd (20 wt. % gold) solid solution alloy. A line profile is shown beneath each image.
Figure 3B:
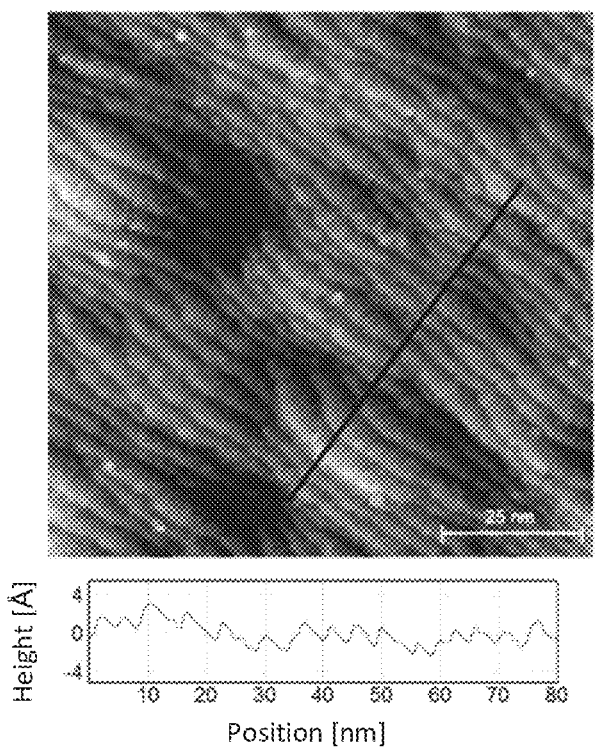

To examine whether the atomic steps can be formed on surfaces of different metallic films, films of silver and gold-palladium (20 wt. % gold) solid solution alloy were deposited on top of a $SiO_2$ layer of thermally oxidized (001) Si wafer followed by the low temperature annealing and template stripping. FIGS. 3A and 3B show step formation in silver and in gold-palladium surfaces, respectively. This demonstrates that the phenomenon of formation of stepped vicinal surfaces is widespread and can be extended to different polycrystalline metallic films.

Example 4

Characterization of Step Direction

Figure 8:
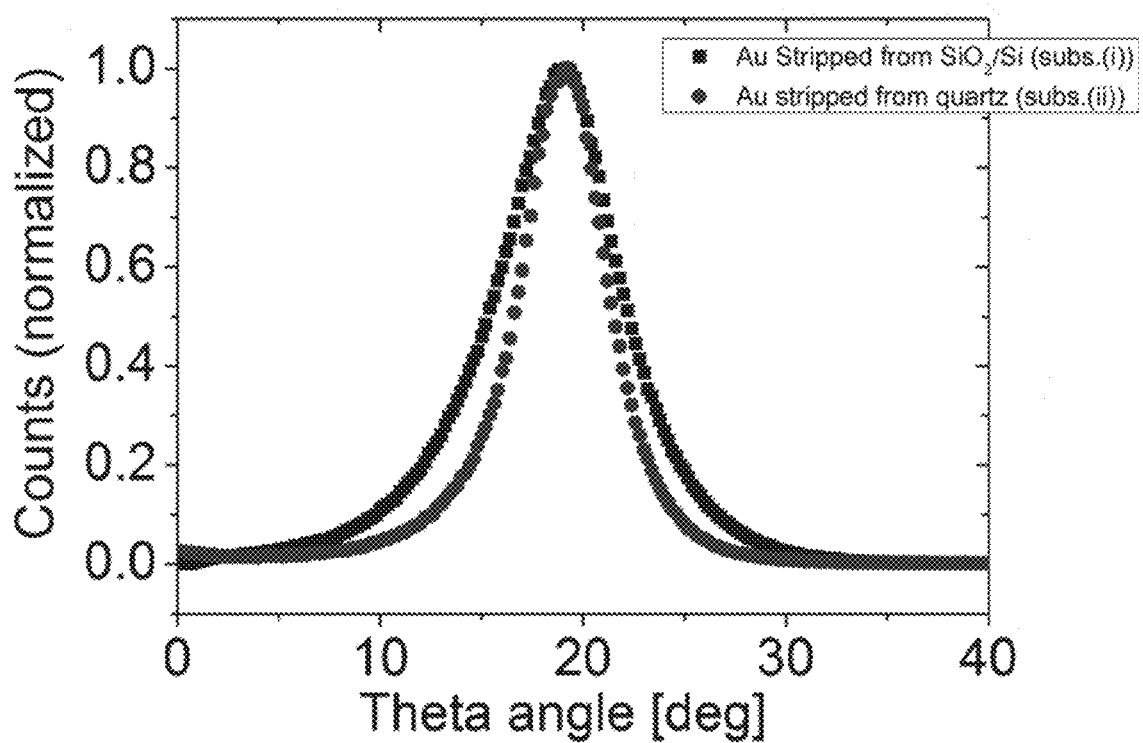
FIG. 8: High Resolution-X-Ray Diffraction (HR-XRD) measurement in the rocking curve mode, showing the different Full Width at Half Maximum (FWHM) values obtained for the {111} reflection of gold layers. Rectangles: film stripped from substrate (i)—$SiO_2$/Si, and circles: film stripped from substrate (ii)—quartz tilted by 3° with respect to the basal plane. The FWHM obtained in each case results from the distribution of particles around the {111} plane.

To characterize the direction of the atomic steps with respect to the grain orientation, X-ray diffraction (XRD) in the Bragg-Brentano scattering geometry was performed. The fact that the step direction was maintained over each entire grain area suggested that the crystallographic properties of each grain dictate its surface structure. It is well known that when an FCC metal is deposited by a physical vapor deposition (PVD) method, the thin polycrystalline film is highly textured with an average preferred orientation of the {111} plane being perpendicular to the substrate (due to surface energy effects). The in-plane orientation, however, is mainly random, i.e., each grain is arbitrarily oriented with respect to its neighbors, forming a powder-like orientation. When X-ray diffraction (XRD) in the Bragg-Brentano scattering geometry is performed, the only diffraction peak observed is that of the {111} atomic planes, while the rocking curve around that orientation (which provides the distribution of the texture) is about 7° in width (FIG. 8). The powder-like in-plane orientation of the grains coincides with the observation that different step directions prevail for different grains (FIG. 2E). With regard to the out-of-plane orientation, it is clear from the rocking curves that the average orientation is that of the {111} type. This means that most grains are slightly tilted, by up to several degrees, relative to this orientation.

Without wishing to be bound by any theory or mechanism of action, it is contemplated that the mechanism of step formation is similar to that of classical vicinal surfaces (surface reconstruction), except that instead of cutting a single crystal from the {111} plane at a small angle (α), there are a multitude of small single crystals that grow on the template during deposition with an initial distribution of misorientation angles ($α_i$) in relation to the {111} plane (FIG. 2B). In classical vicinal surfaces, the terrace length L is a function of the miscut angle a, through the following relation (S. Rousset et al., *Journal of Physics: Condensed Matter*, 15, S3363 (2003)): tan(α)=h/L, where h is the step height, which in an ideal vicinal surface is equal to the {111} interplanar spacing ($d_{111}$=2.355 Å). The larger the miscut angle the smaller the periodicity, and vice versa. In the stepped vicinal surfaces on polycrystalline films of the present invention, the misorientation angle ($α_i$) for each grain is analogous to the miscut angle (FIG. 2B). Without being bound by any theory or mechanism of action, when a metallic thin film is deposited by e-beam or thermal evaporation, the rate of deposition is relatively high and the first layers which are deposited may nucleate from a high-index plane at a small angle to the {111} atomic planes. This is even more pronounced when the film is deposited on an amorphous substrate such as $SiO_2$, as is demonstrated in the present case. The degree of misorientation of each grain off the normal to the {111} plane governs the periodicity of the steps, similar to the scenario observed with the miscut angle in classical vicinal surfaces.

Example 5

The Effect of Substrate Symmetry on Step Periodicity

To study how the control over the initially oriented nucleation would affect the periodicity of the vicinal surface atomic steps, gold films were deposited on substrates having different symmetries. Thus, gold polycrystalline films were deposited on three different silicon oxide-based substrates having similar surface chemistries and stoichiometries but different symmetries and hence different capacities for inducing orientation. The substrates that were used: (i) amorphous $SiO_2$, (ii) 3° miscut basal plane quartz, and (iii) almost perfectly cut basal quartz. Quartz wafers that exhibit different miscuts from the hexagonal lattice basal plane were used (001). As demonstrated hereinbelow, this allowed to vary the degree of induced film orientation. Quartz has a hexagonal symmetry with lattice parameters of a=4.91458 Å and c=5.40649 Å (ICDD card #01-070-7344). Thus, similar to the {111} plane of gold, the basal plane of quartz exhibits 3-fold symmetry of atoms. Although the mismatch ζ between the array of atoms on both surfaces is too large to induce epitaxial growth (ζ=17.4%, calculated according to $$\zeta = \frac{a_1/2(\text{quartz}) - a/\sqrt{2}\,(Au)}{a_1/2(\text{quartz})} = -17.3\%,$$

assuming that replication of the 3-fold quartz ordering by the Au atoms is affected by half of the quartz interatomic distance on the basal plane), it has been well documented that when crystals are grown on substrates that exhibit the same surface symmetry of atoms, oriented growth is induced even in cases of mismatches as high as 30% (J. W. Mullin, *Crystallization* Butterworth Heinemann, Oxford (2001)).

Figure 4A:
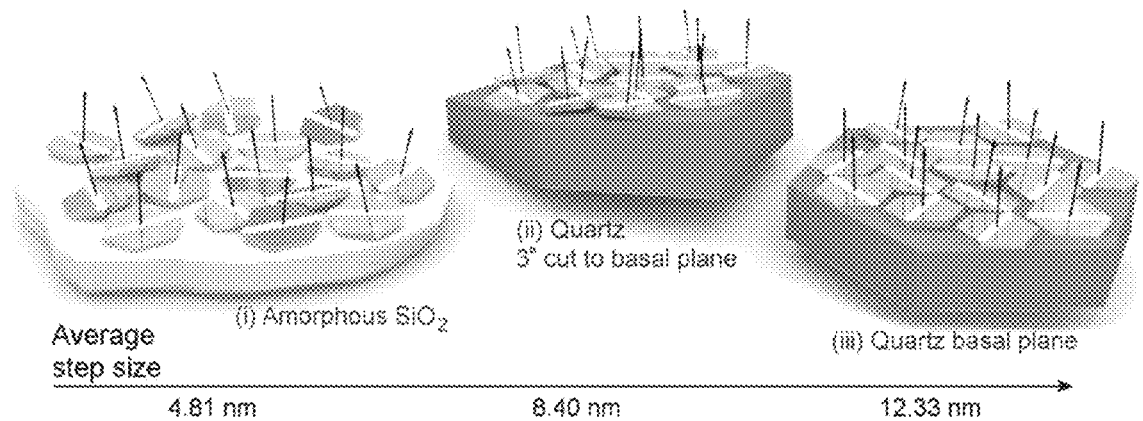
FIGS. 4A-4B.
Figure 4B:
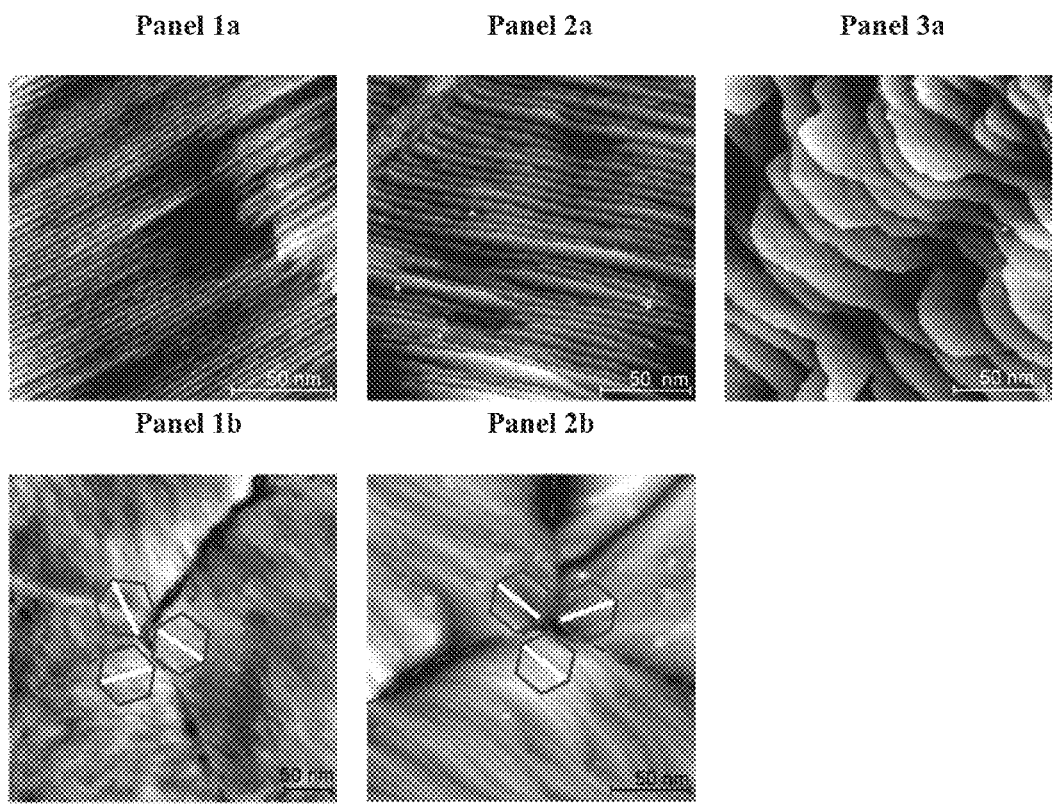

Taking this last factor into account, it was contemplated that the quartz substrates would induce higher degrees of the (111) texture than that induced by the amorphous $SiO_2$ substrate, and that this in turn should directly increase the atomic step periodicity of the gold. FIGS. 4A and 4B demonstrate the atomic steps of stripped gold surfaces that were deposited on the three substrates. It can be seen that the average atomic step periodicity is lowest for the amorphous substrate and increases as the quartz basal plane becomes more on-axis (FIG. 4B, Panels 1a, 2a and 3a). STM characterization over 10 separate grains for each of the three substrates yielded average step periodicities of 4.8 nm, 8.4 nm and 12.3 nm for Au surfaces grown on substrates (i), (ii), and (iii), respectively. The step periodicities obtained for Au surfaces grown on substrate (i) were mostly distributed between 1 nm and 3.5 nm, although areas of larger terraces could also be seen. The stripped surface from substrate (ii) showed more of the intermediate values of step periodicity and less of the extremely dense steps seen on surfaces grown on the amorphous $SiO_2$, implying that the quartz substrate, though not well oriented with respect to the basal plane, induced the 3-fold symmetry in the gold layer. Lastly, for surfaces stripped from substrate (iii), large step periodicities were the most frequently seen (up to ~30 nm). This, as discussed above, originated from the lower misorientation angles induced by the almost perfect 3-fold symmetry of the quartz substrate.

Another indication that the quartz substrates indeed template the growth of gold films despite the large lattice mismatch was that the in-plane orientation of the Au grains was not random. This could be seen from the direction of steps on adjacent grains (FIGS. 4A and 4B). Owing to the 3-fold symmetry, the steps were inclined at 0°, 60°, or 120° with respect to their neighboring grains. Moreover, the rocking curves of films grown on substrates (ii) and (iii) are considerably narrower than the rocking curve of films grown on substrate (i) (4.2° and 4.9°, respectively as compared to)7° (FIG. 8), meaning that the distribution in misorientation decreases when templated.

Example 6

Strip Defect Lines across Stepped Surfaces

Figure 5A:
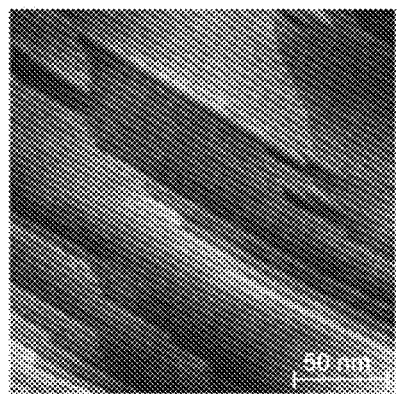
FIGS. 5A-5C: Scanning Tunneling Microscopy (STM) images of stripped gold surfaces that were further annealed after stripping in the STM chamber under UHV conditions.
Figure 5B:
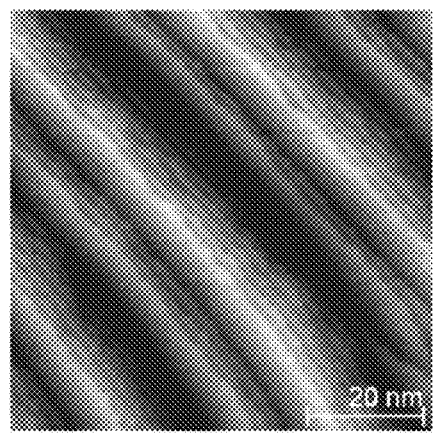
Figure 9A:
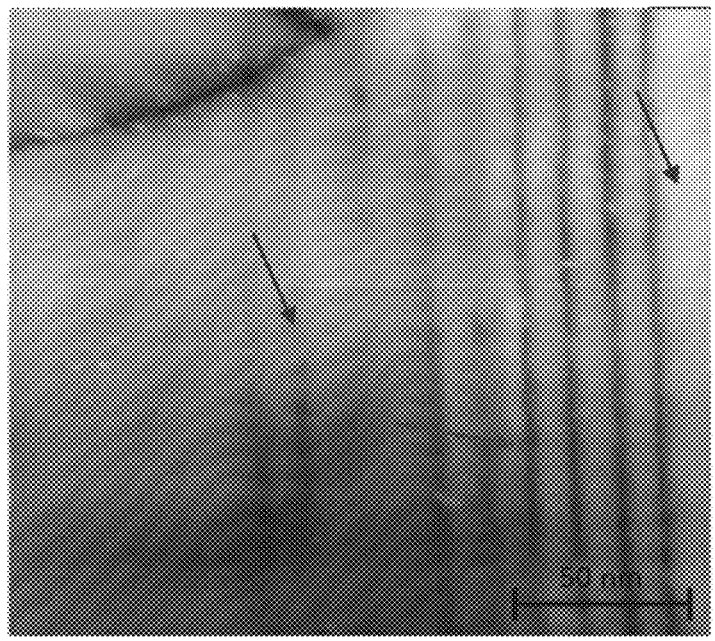
FIGS. 9A-9B: Stacking faults and twin lines that pass through the steps.
Figure 9B:
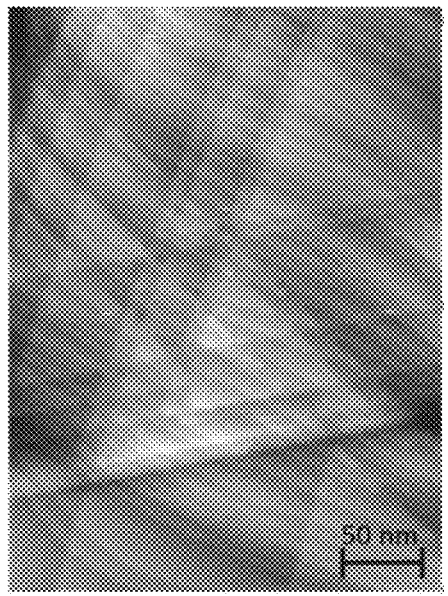

Template stripping in air causes stacking faults and twinning faults produced by the stripping forces applied (S. Borukhin et al., *Langmuir* 27, 13415 (2011)). To rule out other theoretical origins of step formation on the films, such as stress relaxation and formation during the stripping process, additional experiments were performed. First, the stepped surfaces were annealed after stripping at ~300° C. in the STM chamber under UHV for several hours and the surfaces were imaged by STM at the end of this process. As shown in FIGS. 5A and 5B, not only did the steps not disappear (as would be expected in the case of stress relaxation), they became even denser with time. FIGS. 9A and 9B show STM images which confirm that the steps are formed prior to stripping-induced defects, thus eliminating the possibility that the steps were formed as a result of the stripping process (S. Borukhin et al., *Langmuir* 27, 13415 (2011)). Maintenance of the continuous step structure through the line fault areas strongly suggests that the steps were not caused by the stripping process, but rather formed at the Au—$SiO_2$ interface prior to stripping. Additionally, it was observed that the steps already started to form at room temperatures, even prior to annealing, although they were not well ordered. It is contemplated that at least some of these steps start to form during the deposition itself at room temperatures. Without being bound by any theory or mechanism of action, these observations suggest that steps are initiated at room temperatures, while their ordering requires annealing, albeit at rather low temperatures. This phenomenon differs from that seen in single crystals, where high temperatures combined with UHV are required for the faceting of a vicinal surface to occur.

Without being bound by any theory or mechanism of action, it is contemplated that reconstruction of the stepped interface occurs at least partially during the growth itself owing to the high surface energy (J. W. M. Frenken et al., *Physical Review Letters* 82, 3500 (1999)) of the initial nucleating plane. As demonstrated herein, the degree of misorientation tilt governs the density of steps that are formed. It is well known that kinetic processes control crystal nucleation and growth in rapid PVD methods, in which surface defects and deposition rates are major factors which cause stress buildup in the emerging film. As a result, the film undergoes recrystallization processes during which lateral grain growth occurs (R. Koch, *J. Phys.: Condens. Matter* 6 (1994)). It is contemplated that during the massive diffusion processes, the film goes through relaxation by reducing the high-index plane surface energies, to form atomic steps of low index planes. The atom that is most distant from the silica is only an atomic step-height away from it, and still maintains the van-der-Waals forces with its substrate.

Example 7

Figure 5C:
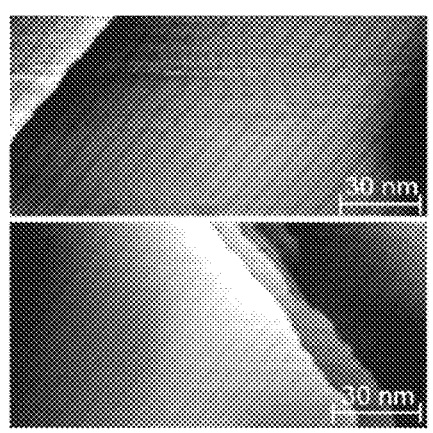

Characterization of Stepped Vicinal Surfaces on Polycrystalline Au Ultra-thin Film In order to characterize the formed stepped vicinal surfaces, post-stripping annealing in the STM chamber under UHV conditions was performed. Phenomena which are known to occur in classical vicinal surfaces were observed. In surfaces having dense atomic steps, annealing after stripping in UHV was found to lead, as with classical vicinal surfaces, to step roughening and bunching. In surfaces having atomic steps of lower density, annealing in UHV after stripping revealed the herringbone reconstruction lines (FIG. 5C), which in some cases were parallel and in other cases perpendicular to the step edges, as reported also for classical vicinal surfaces produced on a single gold crystal (V. Repain et al., *Physical Review Letters* 84, 5367 (2000)). To the Applicant's best knowledge, the herringbone reconstruction has never been seen on polycrystalline thin films of gold other than under special conditions such as with epitaxial gold grown on mica and flame annealed (N. Spiridis et al., *Surf Sci* 546, 507 (2002)).

Example 8

Figure 10A:
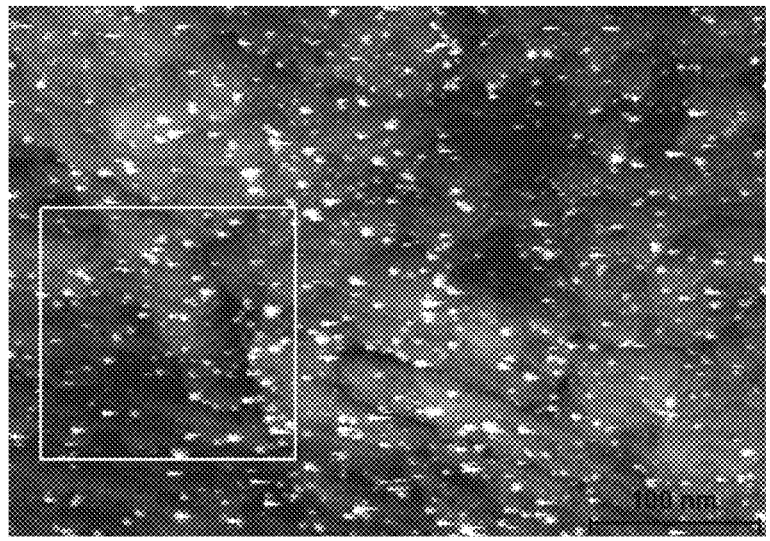
FIGS. 10A-10B: STM images of SAMs 12-mercaptodo-decanoic acid molecules, deposited from 5 mM solution in ethanol onto stepped Au surface, and annealed for several hours at 90-110° C.
Figure 10B:
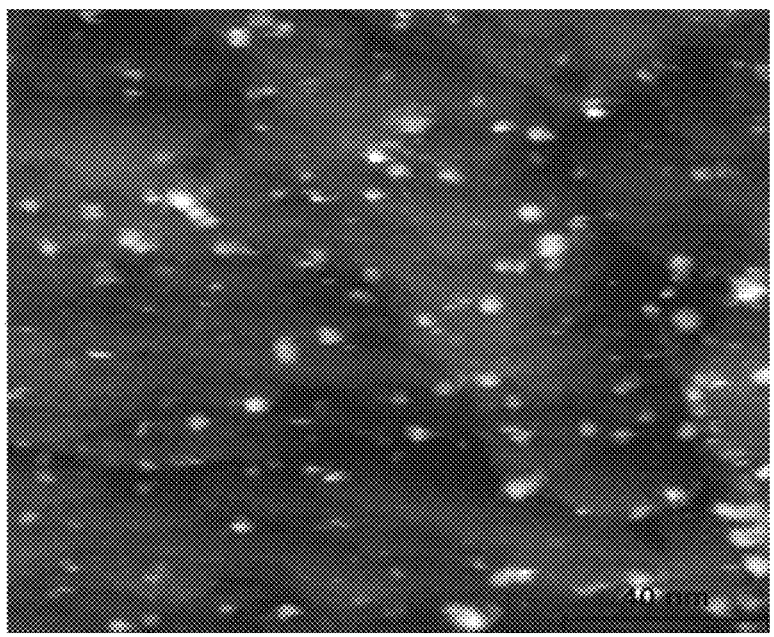

Adsorption of Organic Molecules on Vicinal Surfaces of Polycrystalline Materials Self-Assembled Monolayers on Stepped Gold Surfaces In order to demonstrate the capabilities of stepped vicinal surfaces to bind organic molecules for obtaining controlled Self-Assembled Monolayers (SAMs), 12-mercaptododecanoic acid molecules were deposited from solution onto vicinal surfaces of polycrystalline gold. SAMs 12-mercaptododecanoic acid (purchased from Sigma-Aldrich) were dissolved in a concentration of 5 mM in pure ethanol. Au stepped vicinal surfaces prepared according to Example 1 were immersed in the solution for five minutes followed by one minute sonication in an ultrasonic bath. The samples were then taken out of the solution and immersed in pure ethanol inside an ultrasonic bath for cleaning the extra SAMs that were not strongly attached to the surface. The samples were then inserted into an STM vacuum chamber and were subjected to two sequential stages of heat treatment at 90° C. and 110° C. under high vacuum. Each annealing stage was performed for several hours. The samples were then left to cool down to room temperatures under high vacuum for several additional hours prior to being observed in an STM. Representative STM images are provided in FIGS. 10A and 10B.

The SAMs molecules, which appear as white dots, are mostly bound at sites located at the contours of the steps. These molecules are strongly bound to the surface and remain bound even during the heat treatment under vacuum. It is evident that white dots are rarely seen at the inner flat areas of the terraces. Without being bound by any theory or mechanism of action, SAMs molecules do not bind to the flat areas as strongly as they bind to step edges and are more rapidly desorbed from the flat areas during annealing. Since the STM images were taken after the annealing step, only strongly bound molecules at the reactive sites of step edges are seen (S. Du et al., *Physical Review Letters* 97, 156105 (2006)). Hence, the vicinal surfaces of the present invention specifically and strongly bind organic molecules which are selectively localized at low energy sites.

Cysteine on Stepped Gold Surfaces

In order to test the ability of biologically active molecules to bind to the stepped vicinal surfaces of the present invention, cysteine as a representative amino acid which has a thiol side chain was used. Cysteine was shown to have high affinity to coinage metals as well as the ability to adsorb and self-assemble on single crystal gold surfaces, polycrystalline gold on mica and Si substrates (A. Kuhnle et al., *Nature* 415, 891 (2002); A. Ihs et al., *Journal of Colloid and Interface Science* 144, 282 (1991); A. S. Dakkouri et al., *Langmuir* 12, 2849 (1996); G. Dodero et al., *Colloids and Surfaces A: Physicochemical and Engineering Aspects* 175, 121 (2000)).

L-cysteine (purchased from Sigma-Aldrich) was dissolved at a concentration of 10 mM in highly purified milliQ water. The aqueous solution was then sonicated and left for one hour to afford full dissolution. Polycrystalline stepped gold films prepared according to Example 1, were placed in the solution for twenty minutes with occasional sonication. The samples were then transferred into a small vile containing clean pure water and sonicated for one minute for removing extra unbound cysteine molecules. The samples were then dried with nitrogen and inserted into an STM vacuum chamber. The samples were heated to 110° C. for 8 hours inside the STM vacuum chamber, and were left to cool to room temperatures for several hours before measuring.

Figure 11A:
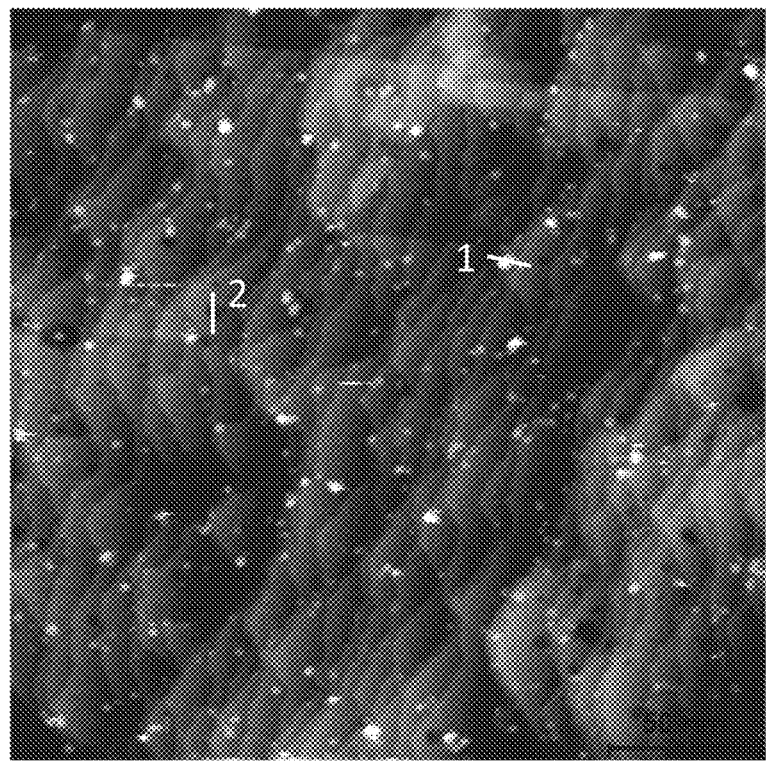
FIGS. 11A-11B.
Figure 11B:
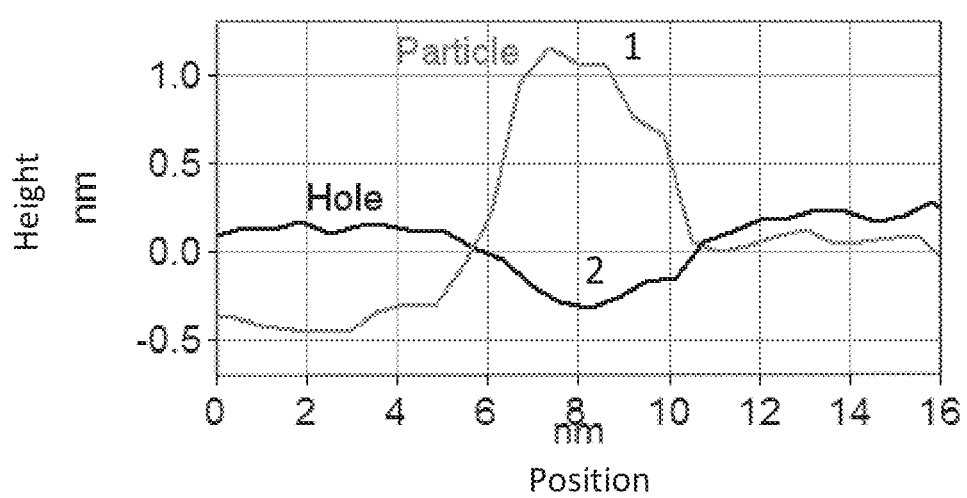

FIG. 11A shows the gold stepped surface and the deposited cysteine molecules (white dots) that remained after the heat treatment. The cysteine molecules are clearly seen to be mostly located at step edges, and are more rarely found inside terrace areas. Dark dots, which represent holes that are typically of one to several monolayers in depth, are seen on several terraces. Without being bound by any theory or mechanism of action, the dark dots represent areas from which the cysteine molecules desorbed while causing a detachment of part of the gold layer (A. Kuhnle et al., *Nature* 415, 891 (2002); A. S. Dakkouri et al., *Langmuir* 12, 2849 (1996)). The cysteine remains attached to step edges, while it is less often observed on surface areas inside the large terraces, on which it is probably less adsorbed and more rapidly desorbed, leaving holes at the surface.

Thus, the vicinal surfaces of polycrystalline materials of the present invention are capable of adsorbing cysteine and affording its self-assembly on the surfaces. The surfaces further allow a controlled surface coverage with cysteine which is strongly bound to the energetically favorable step edges sites with high affinity. The cysteine molecules remain bound during annealing of the film under high vacuum conditions in step edges, while being more rapidly desorbed from flat terraces.

Figure 12A:
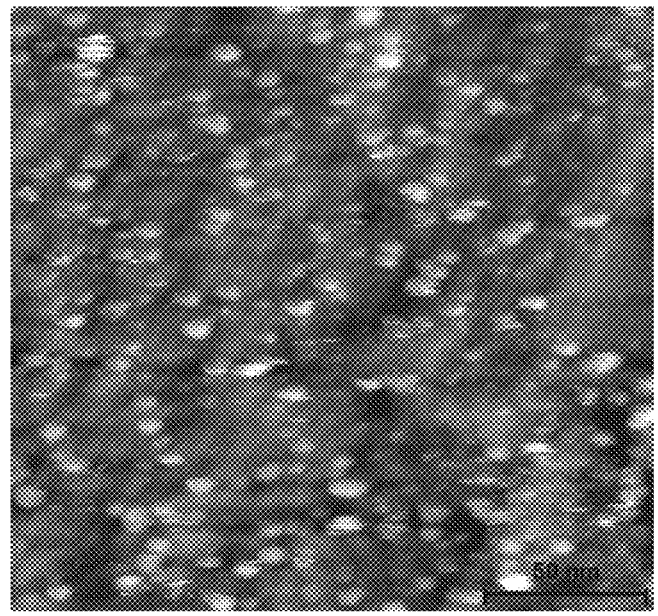
FIGS. 12A-12D: STM images of different areas of a stepped gold sample, immersed in 10 mM cysteine in aqueous solution (milliQ) for 200 minutes, and heated to 110° C. for several hours.
Figure 12B:
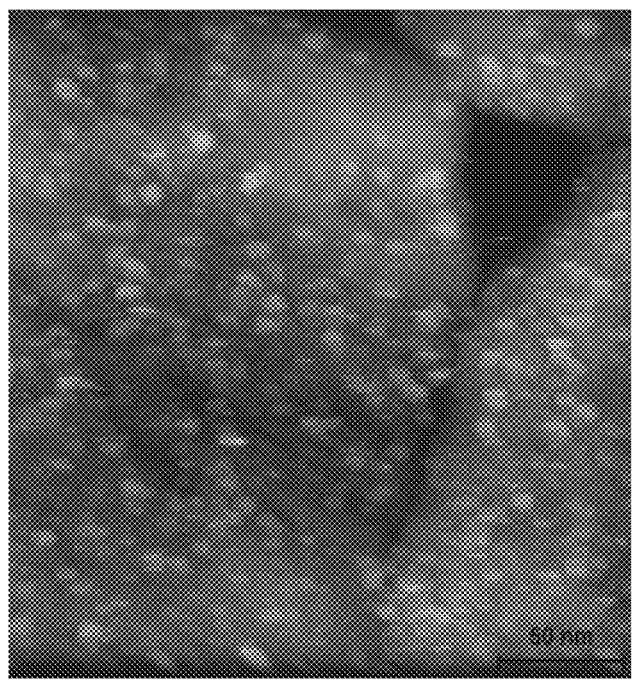
Figure 12C:
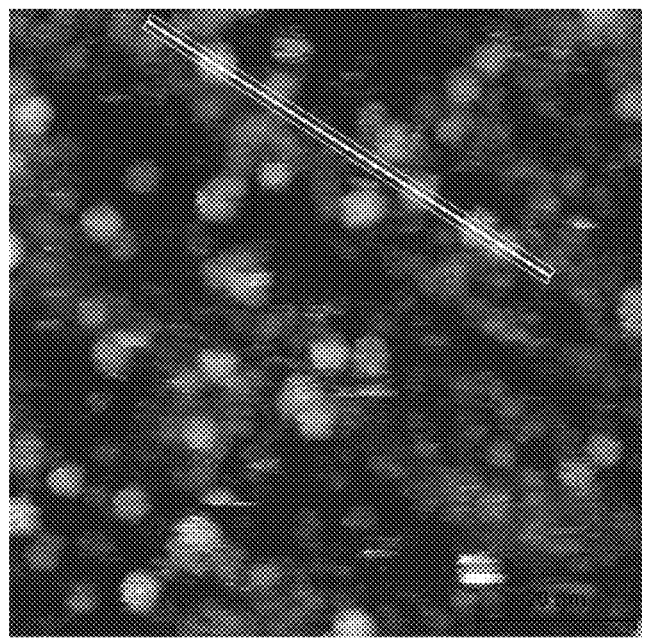
Figure 12D:
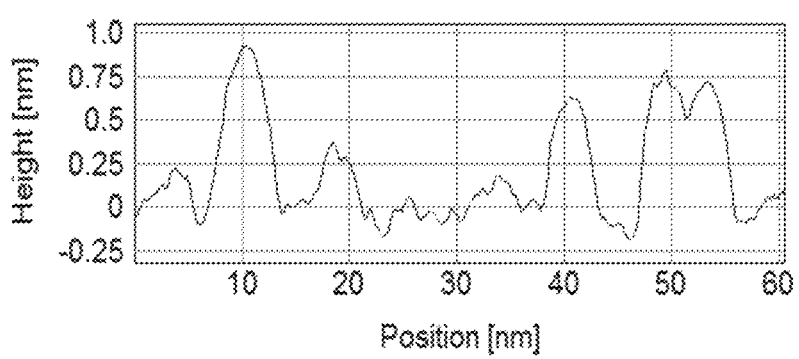

When higher concentrations of cysteine molecules were used by increasing the time duration of which the sample was immersed in solution from 20 minutes to 200 minutes, more white dots appeared (FIGS. 12A-12D). Without being bound by any theory or mechanism of action, the more blurry image of the STM is obtained due to the effect of nonconductive species (cysteine molecules) which are present at large amounts thus screening the conductive gold surface. FIG. 12A shows a high density of surface steps. The absence of cysteine molecule on a flat terrace area is seen in FIG. 12B.

Example 9

Adsorption of Metal Atoms on Vicinal Surfaces of Polycrystalline Materials

Mercury on Stepped Gold Surfaces

The effect of step reactivity on the adsorption and binding of metal atoms was tested by evaporating mercury atoms from a mercury droplet onto the stepped surfaces of a gold polycrystalline film. Mercury is known to evaporate to a gas phase at room temperatures due to its high vapor pressure. By controlling the time duration for which the polycrystalline film having vicinal surface is exposed to the gas phase of a known size of a mercury droplet, the total amount of mercury atoms that reach the vicinal surface can be controlled. Mercury, at quantities that are lower than one monolayer, has a large sticking coefficient to gold and a high surface diffusivity on gold surfaces.

Polycrystalline Au vicinal surface prepared according to Example 1 was placed facing down at the top of a vile that contained a mercury droplet of 2 µl. The vial was several centimeters in height. The stepped gold surface was subjected to the gas phase of the mercury droplet, for durations of 5 seconds, 50 seconds and 1.5 minutes at room temperatures to obtain mercury atoms at the surface, at different total amounts, all below an amount which produces a single monolayer.

Figure 13:
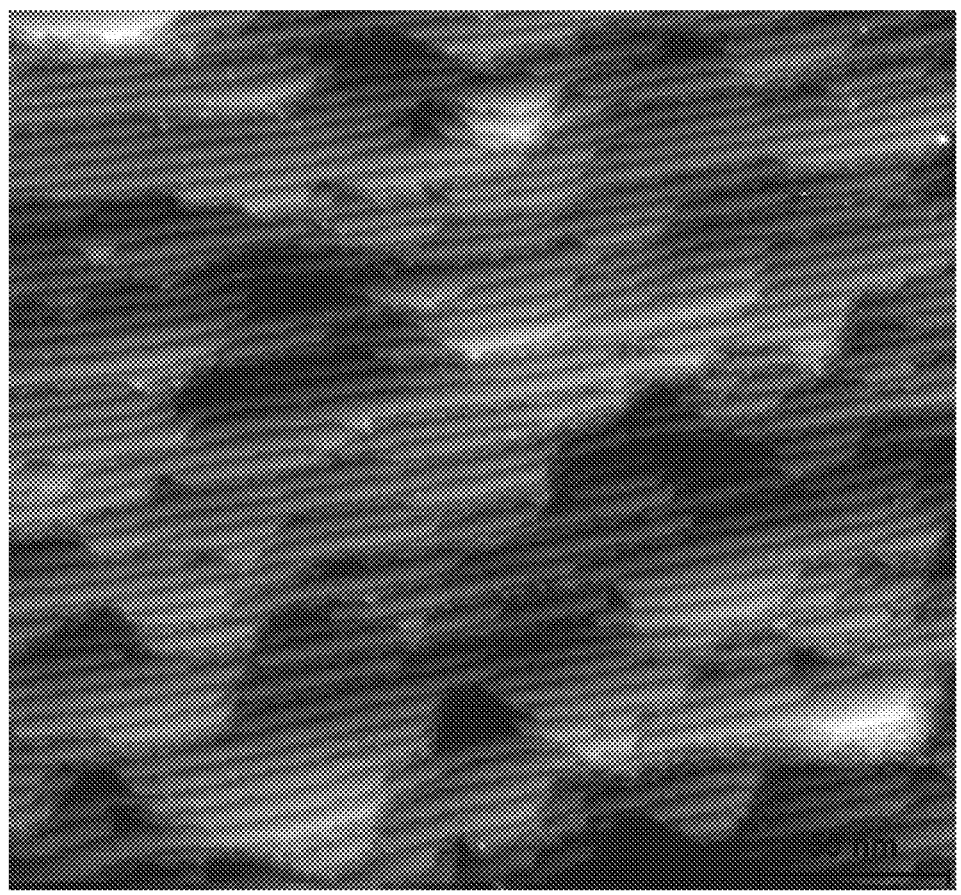
FIG. 13: STM image of an area characterized by dense steps on the surface of stepped Au, after a short exposure of 5 seconds to a 2 μl droplet of Hg at room temperatures. Small grained clusters are seen at the step edges.

At short exposure duration (5 seconds), the effect of mercury atoms on the surface is not very profound. However, when looking at the step edges at high magnifications, small grains of mercury clusters or intermetallics grains formed at the step edges can be seen (FIG. 13).

Figure 14A:
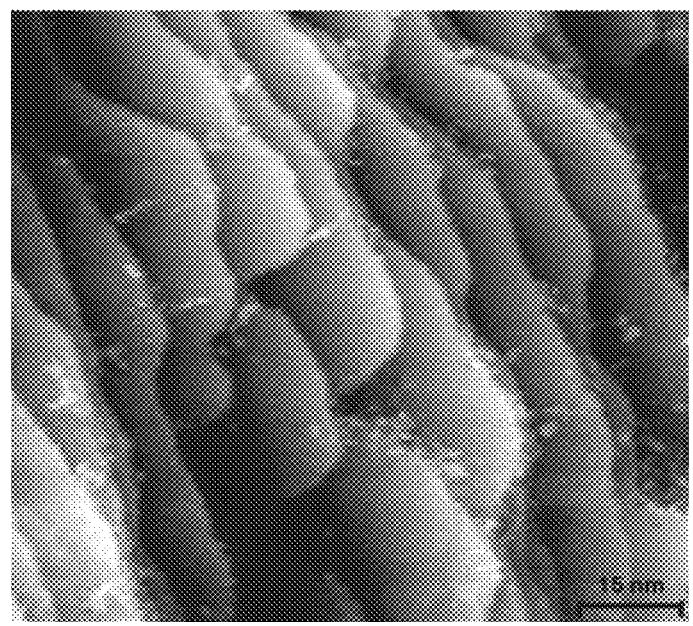
FIGS. 14A-14D: STM images of large terrace areas on a stepped Au surface of a sample after an exposure of 50 seconds to a 2 ∞l droplet of Hg. The images show branches of Hg starting from step edges.
Figure 14B:
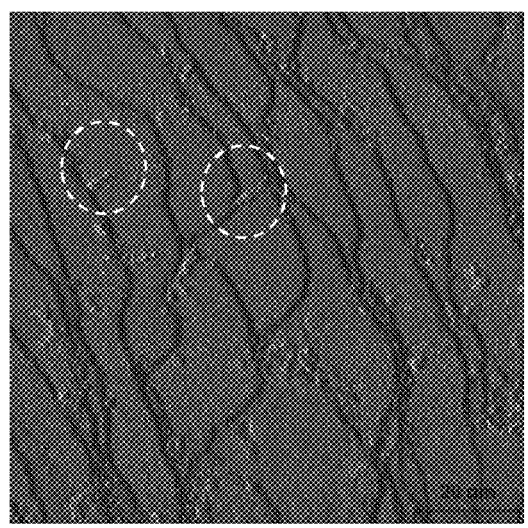
Figure 14C:
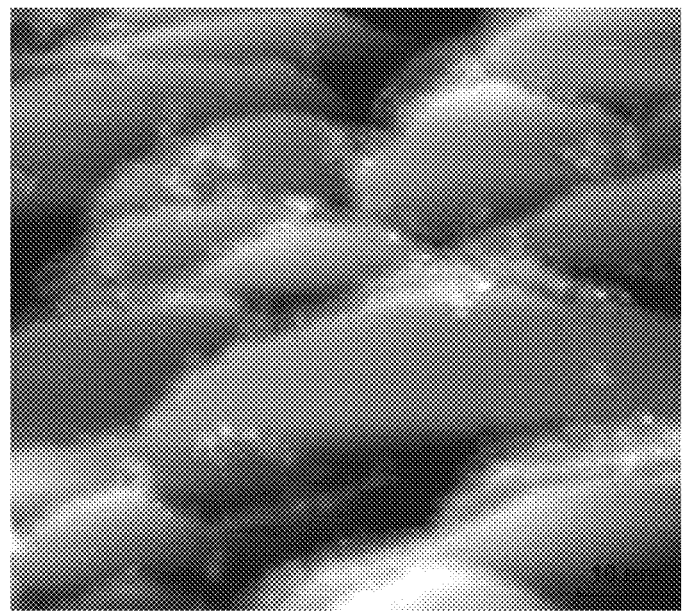
Figure 14D:
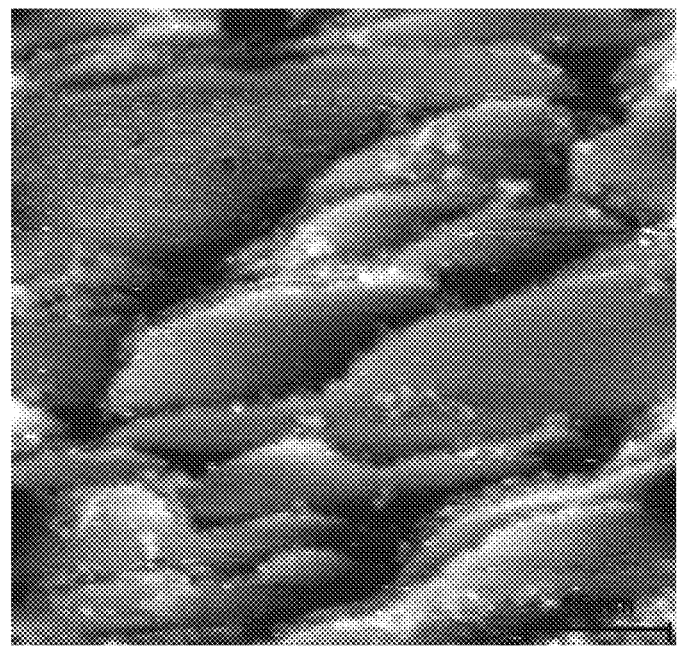
Figure 15A:
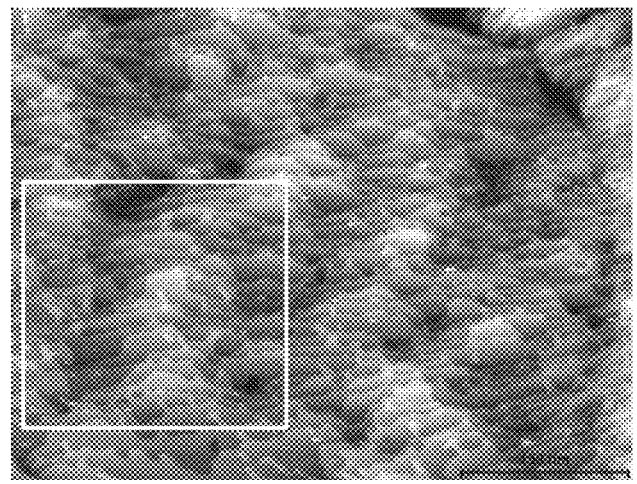
FIGS. 15A-15D: STM images of large terrace areas on a stepped Au surface of a sample after an exposure of 1.5 minutes to a 2 µl droplet of Hg. The clusters are wider and thicker as compared to clusters obtained in shorter exposure time of 50 seconds.
Figure 15B:
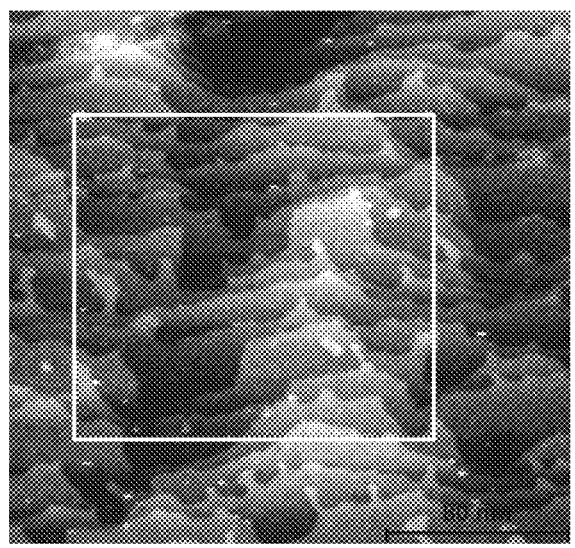
Figure 15C:
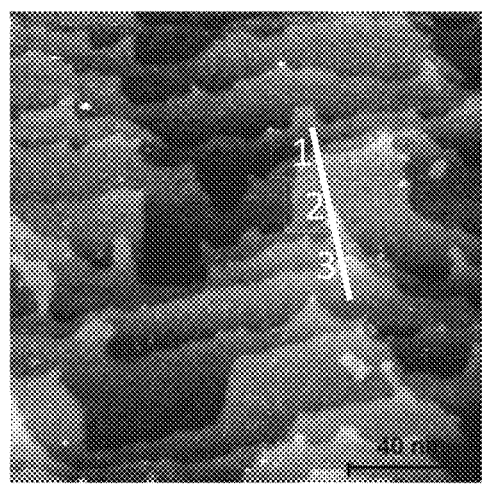
Figure 15D:
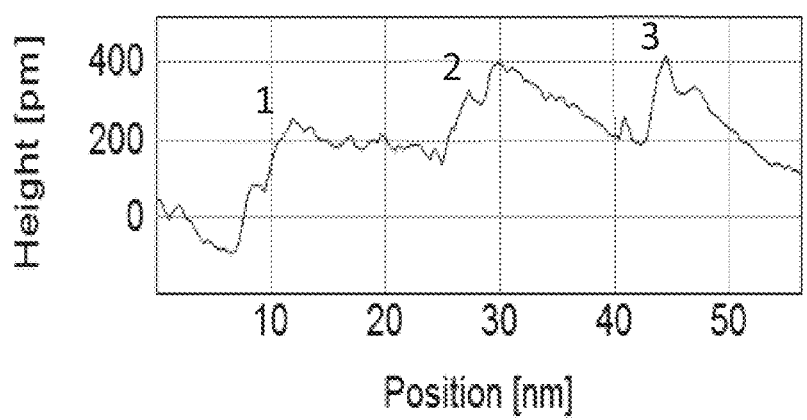

When exposing the stepped gold surface to larger amounts of mercury atoms by increasing the exposure time to 50 seconds, new structures are clearly seen (FIGS. 14A-14D). The mercury atoms preferably bind to step edges, concentrate thereon and form clusters. These clusters seem to grow laterally and in some instances send 1D branches from the step edges forward (FIG. 14A and 14B). These unique structures that are formed at step edges appear throughout the entire stepped gold surface.

When exposing the stepped gold surface to even larger amounts of mercury atoms by increasing the total exposure time to 1 5 minutes, larger clusters are seen at the step edges (FIGS. 15A-15D). The clusters grow wider and thicker at the step edges, as is evident from the high resolution images, and the corresponding line scan in FIGS. 15C and 15D, respectively. These clusters are contemplated to be intermetallics rich in mercury that are formed in areas having elevated mercury concentrations in the vicinity of the step edges.

Figure 16A:
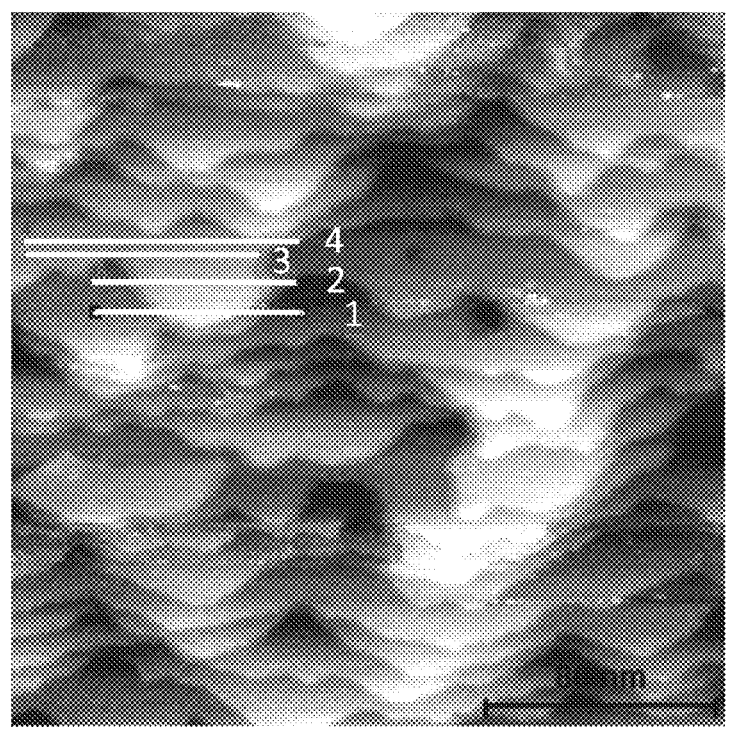
FIGS. 16A-16D: STM images of steps and terrace areas on the surfaces of stepped Au samples after an exposure of 1 5 minutes to a 2 µl droplet of Hg and annealing at 100° C. for different time durations.
Figure 16B:
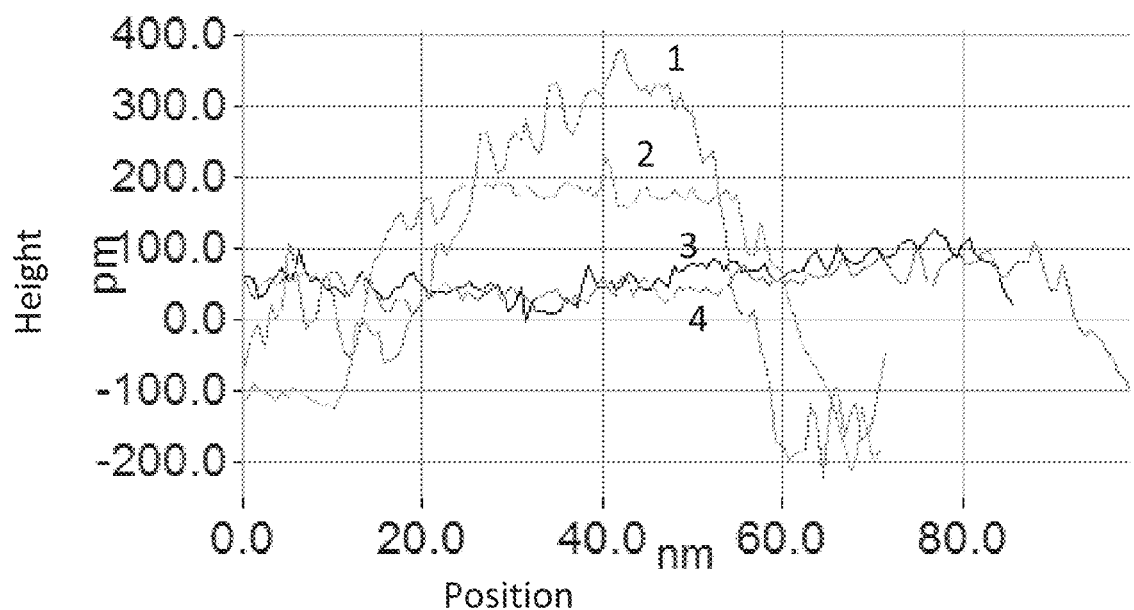
Figure 16C:
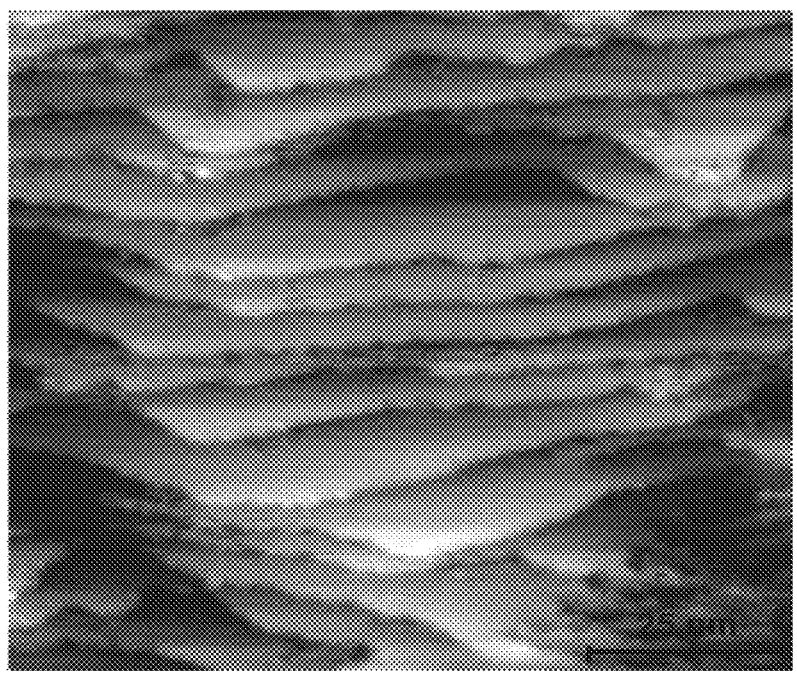
Figure 16D:
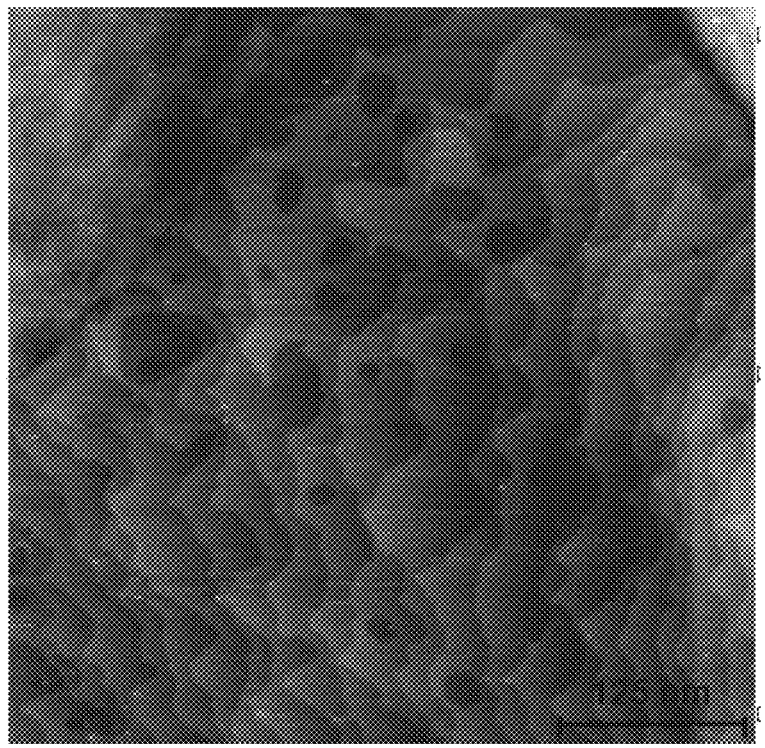

The samples that were subjected to mercury for 1.5 minutes were further subjected to a heat treatment at 100° C. for 4 hours. The results are presented in the STM image of FIG. 16A and the corresponding line scans across one terrace in FIG. 16B. The clusters clearly became thicker and more cloud-like shaped, still being concentrated at step edges, although being more spread across step perimeter and towards inner areas of each terrace. The thicker mercury clusters at step edges are reduced in thickness towards inner terrace areas, as evident by the STM image and line scans. The samples were further annealed overnight. This resulted in noisy and more non-uniform terraces with wider step edges, as shown in FIGS. 16C and 16D, suggesting a more homogeneous spread of the Hg at the terrace edge perimeters and inside the terrace areas at the surface, as well as a possible diffusion of part of the Hg deep into the bulk film after the long annealing process.

Mercury atoms are highly mobile on gold flat terraces (M. A. George et al., *Thin Solid Films* 245, 215 (1994)). Hg atoms were shown to form monolayers of network-like islands that are homogeneously spread throughout each terrace on surfaces of large flat terraces of gold and silver on cleaved mica (M. A. George et al., *Thin Solid Films* 245, 215 (1994); M. Levin et al., *Fresenius J Anal Chem* 365, 577(1999)).

The vicinal surfaces of polycrystalline gold of the present invention are shown to be characterized by a high density of (few nanometers) short steps. Without being bound by ant theory or mechanism of action, these surfaces show a different mechanism of particle adsorption and cluster growth than the hitherto known particle adsorption and growth. In the case of short steps, the high density of active sites at step edges dictates the initial bonding. The mercury atoms that reach the surface diffuse on the surface and reach the highly reactive, poorly bonded, step edges. The atoms show a high affinity to these sites thereby remaining strongly bound thereto. The atoms which concentrate at the edges, start growing laterally from these sites forward. The lateral growth has the form of 1D or 2D clusters, depending on the concentration of Hg atoms. The growth of clusters might be maintained through Hg-Hg attractive interactions on the active step edges. These clusters grow wider when increasing the amount of Hg atoms that reach the surface. Due to the high surface self-diffusion of gold ($D_o=6 \cdot 10^{-15}$ cm$^{-2}$S$^{-1}$; H. Okamoto et al., *ASM International: Metals Park, OH*, 112 (1987)), these Hg rich clusters may form intermetallic regions with time and heat treatment. Thus, vicinal surfaces of polycrystalline gold of the present invention provide the selective adsorption of metals onto low energetic sites at edge steps.

The formation of vicinal stepped surfaces on thin polycrystalline films has a profound impact in many areas of science and technology owing to the ease and relatively low cost of their formation and the versatile periodicities that can be formed. The ability to form such surfaces on a variety of metals and similarly on other materials without the need for single crystals, ion bombardment, high annealing temperatures or UHV conditions represents a great technological advantage not described hereinbefore. The topographical characteristics of the vicinal surfaces of the present invention may be controlled and varied according to need thus providing, for example vicinal surfaces having high density of short steps and high density of step edge active sites over large surface areas.

The vicinal surfaces on thin polycrystalline films of the present invention are shown to possess selective adsorption of a variety of organic molecules and metal atoms onto reactive step edges, similar to vicinal surfaces of single crystals. The reactivity of the step edges afford the specific and selective binding of molecules in a controlled amount thus providing controlled surface coverage. The bound molecules remain stable on the surface and do not detach from it even at high temperatures and high vacuum conditions. The surfaces of the present invention afford the adsorption of metal atoms to form 1D and 2D lateral domains, originated at step edges. These structures possess enhanced chemical, electrical and magnetic properties which can be utilized in a variety of nano- and bio-technology applications.

It is appreciated by persons skilled in the art that the present invention is not limited by what has been particularly shown and described hereinabove. Rather the scope of the present invention includes both combinations and subcombinations of various features described hereinabove as well as variations and modifications. Therefore, the invention is not to be constructed as restricted to the particularly described embodiments, and the scope and concept of the invention will be more readily understood by references to the claims, which follow.

The invention claimed is:

1. A polycrystalline material comprising grains, each grain being misoriented with respect to its neighbors, wherein said polycrystalline material comprises misoriented grains throughout its entire thickness and on its surfaces, and wherein at least one surface of the polycrystalline material is a vicinal surface having stepped terraces comprising steps of atomic scale.

2. The polycrystalline material according to claim 1 in the form of a structure having a substantially flat architecture or a three-dimensional architecture.

3. The polycrystalline material according to claim 2, in the form of a polycrystalline film.

4. The polycrystalline material according to claim 1 comprising a metal or a metal alloy.

5. The polycrystalline material according to claim 4, wherein the metal or metal alloy is selected from the group consisting of Au, Ag, Pd, Ni, Co, Pt, Cu, Al, Ir, Mn, Fe, and an alloy thereof.

6. The polycrystalline material according to claim 1 comprising a semiconductor selected from the group consisting of Si, SiO$_2$, TiO$_2$, CeO$_2$, V$_2$O$_5$, PbS, AlN, Si$_3$N$_4$, InP, GaN, GaP, CdS, CdTe, CdZnTe, GaAs, InAs, InSb, ZnS, ZnSe, and ZnTe.

7. The polycrystalline material according to claim 1, wherein the stepped terraces have step periodicities in the range of about 1 nm to about 500 nm.

8. The polycrystalline material according to claim 1 used for microelectronics, catalysis, direction of nanowire arrays, patterning of nanostructures and magnetic domains or assembling of organic and inorganic molecules.

9. A method of preparing a polycrystalline material comprising grains, each grain being misoriented with respect to its neighbors, wherein said polycrystalline material comprises misoriented grains throughout its entire thickness and on its surfaces, and wherein at least one surface of the polycrystalline material is a vicinal surface having stepped terraces comprising steps of atomic scale, the method comprising the steps of:

a. depositing a polycrystalline material on a substrate;
b. optionally annealing the deposited polycrystalline material on the substrate obtained in step (a); and
c. removing the polycrystalline material obtained in step (a) or (b) from the substrate so as to expose a vicinal surface of the polycrystalline material having stepped terraces comprising steps of atomic scale.

10. The method according to claim 9, wherein the polycrystalline material is in the form of a structure having a substantially flat architecture or a three-dimensional architecture.

11. The method according to claim 10, wherein the polycrystalline material is in the form of a polycrystalline film.

12. The method according to claim 9, wherein the step of depositing a polycrystalline material comprises the use of at least one technique selected from the group consisting of physical vapor deposition (PVD), chemical vapor deposition (CVD), liquid phase epitaxy, solid phase epitaxy, spin coating, dip-coating, screen printing, sol-gel printing, electrodeposition, electroless deposition, and electrophoretic deposition.

13. The method according to claim 9, wherein the polycrystalline material comprises a metal or a metal alloy selected from the group consisting of Au, Ag, Pd, Ni, Co, Pt, Cu, Al, Ir, Mn, Fe, and an alloy thereof.

14. The method according to claim 9, wherein the polycrystalline material comprises a semiconductor selected from the group consisting of Si, $SiO_2$, $TiO_2$, $CeO_2$, $V_2O_5$, PbS, AlN, $Si_3N_4$, InP, GaN, GaP, CdS, CdTe, CdZnTe, GaAs, InAs, InSb, ZnS, ZnSe, and ZnTe.

15. The method according to claim 9, wherein the substrate is selected from the group consisting of $SiO_2$, $Al_2O_3$, MgO, $SrTiO_3$, ZnO, $GeO_2$, TiO, ZrO, $CeO_2$, $V_2O_5$, $CrO_3$, FeO, CuO, NiO, MnO, ZnO, $Re_2O_7$, $MoO_3$, $W_2O_3$, $Ta_2O_5$, $Nb_2O_5$ and $HfO_2$.

16. The method according to claim 9, wherein the substrate comprises $SiO_2$ in an amorphous or crystalline (quartz) form.

17. The method according to claim 9, wherein the step of annealing is performed at temperatures in the range of about 40-400° C.

18. The method according to claim 9, wherein the step of removing the polycrystalline material from the substrate comprises stripping the obtained material from the substrate or etching the substrate.

19. The method according to claim 18, wherein the stripping comprises mechanical stripping or chemical stripping.

20. The method according to claim 9, wherein the stepped terraces have step periodicities in the range of about 1 nm to about 500 nm.

21. A polycrystalline material comprising grains, each grain being misoriented with respect to its neighbors, wherein said polycrystalline material comprises misoriented grains throughout its entire thickness and on its surfaces, wherein at least one surface of the polycrystalline material is a vicinal surface having stepped terraces comprising steps of atomic scale, wherein the material is prepared according to a method comprising the steps of:
a. depositing a polycrystalline material on a substrate;
b. optionally annealing the deposited polycrystalline material on the substrate obtained in step (a); and
c. removing the polycrystalline material obtained in step (a) or (b) from the substrate so as to expose a vicinal surface of the polycrystalline material having stepped terraces comprising steps of atomic scale.

22. The polycrystalline material according to claim 1, wherein each grain of the at least one vicinal surface has stepped terraces comprising steps of atomic scale.

* * * * *